(12) United States Patent
McElrea et al.

(10) Patent No.: US 7,923,349 B2
(45) Date of Patent: Apr. 12, 2011

(54) WAFER LEVEL SURFACE PASSIVATION OF STACKABLE INTEGRATED CIRCUIT CHIPS

(75) Inventors: Simon J. S. McElrea, Scotta Valley, CA (US); Terrence Caskey, Santa Cruz, CA (US); Scott McGrath, Scotts Valley, CA (US); DeAnn Eileen Melcher, San Jose, CA (US); Reynaldo Co, Scotts Valley, CA (US); Lawrence Douglas Andrews, Jr., Los Gatos, CA (US); Weiping Pan, Santa Clara, CA (US); Grant Villavicencio, Scotts Valley, CA (US); Yong Du, Cupertino, CA (US); Scott Jay Crane, Aromas, CA (US); Zongrong Liu, Cupertino, CA (US)

(73) Assignee: Vertical Circuits, Inc., Scotts Valley, CA (US)

(*) Notice: Subject to any disclaimer, the term of this patent is extended or adjusted under 35 U.S.C. 154(b) by 135 days.

(21) Appl. No.: 12/142,589

(22) Filed: Jun. 19, 2008

(65) Prior Publication Data
US 2008/0315434 A1 Dec. 25, 2008

Related U.S. Application Data

(60) Provisional application No. 60/945,005, filed on Jun. 19, 2007, provisional application No. 60/956,348, filed on Aug. 16, 2007.

(51) Int. Cl.
*H01L 21/46* (2006.01)
*H01L 21/78* (2006.01)
*H01L 21/301* (2006.01)

(52) U.S. Cl. . 438/460; 438/113; 438/106; 257/E21.214; 257/E21.237; 257/E21.238; 257/E21.483; 257/E21.499

(58) Field of Classification Search .................. 438/113, 438/460, 106, 584, 780; 257/E21.214, 237, 257/238, 499, 483
See application file for complete search history.

(56) References Cited

U.S. PATENT DOCUMENTS

| 4,323,914 | A | | 4/1982 | Berndlmaier et al. |
| 5,538,758 | A | | 7/1996 | Beach et al. |
| 5,675,180 | A | * | 10/1997 | Pedersen et al. ............. 257/685 |
| 5,691,248 | A | | 11/1997 | Cronin et al. |
| 5,716,759 | A | | 2/1998 | Badehi |
| 5,870,351 | A | | 2/1999 | Ladabaum et al. |
| 6,107,164 | A | | 8/2000 | Ohuchi |
| 6,255,726 | B1 | | 7/2001 | Vindasius et al. |
| 6,297,657 | B1 | | 10/2001 | Thiessen et al. |

(Continued)

OTHER PUBLICATIONS

International Search Report for PCT Application No. PCT/US2008/067541, mailed Oct. 27, 2008.

(Continued)

*Primary Examiner* — David Nhu
(74) *Attorney, Agent, or Firm* — Haynes Beffel & Wolfeld LLP; Bill Kennedy

(57) ABSTRACT

An electrically insulative conformal coating is applied at least to the active (front) side and one or more sidewalls of the die during wafer processing. Also, a die has an electrically insulative conformal coating applied to at least the active (front) side and sidewalls. Also, assemblies include a stack of such die, electrically interconnected die-to-die; and assemblies include such a die or a stack of such die, electrically interconnected to underlying circuitry (for example in a substrate or a circuit board).

25 Claims, 17 Drawing Sheets

U.S. PATENT DOCUMENTS

| | | | |
|---|---|---|---|
| 6,303,977 | B1 | 10/2001 | Schroen et al. |
| 6,338,980 | B1 | 1/2002 | Satoh |
| 6,351,030 | B2 | 2/2002 | Havens et al. |
| 6,582,992 | B2 | 6/2003 | Poo et al. |
| 6,624,505 | B2 | 9/2003 | Badehi |
| 6,667,543 | B1 | 12/2003 | Chow et al. |
| 6,674,159 | B1 | 1/2004 | Peterson et al. |
| 6,706,971 | B2 | 3/2004 | Albert et al. |
| 6,722,213 | B2 | 4/2004 | Offen et al. |
| 6,777,767 | B2 | 8/2004 | Badehi |
| 6,844,623 | B1 | 1/2005 | Peterson et al. |
| 6,908,784 | B1 | 6/2005 | Farnworth et al. |
| 6,910,268 | B2 | 6/2005 | Miller |
| 6,940,022 | B1 | 9/2005 | Vinciarelli et al. |
| 6,956,283 | B1 | 10/2005 | Peterson |
| 6,964,915 | B2 | 11/2005 | Farnworth et al. |
| 6,972,480 | B2 | 12/2005 | Zilber et al. |
| 6,973,718 | B2 | 12/2005 | Sheppard, Jr. et al. |
| 7,029,949 | B2 | 4/2006 | Farnworth et al. |
| 7,215,018 | B2 | 5/2007 | Vindasius et al. |
| 7,221,051 | B2 | 5/2007 | Ono et al. |
| 7,259,455 | B2 | 8/2007 | Seto |
| 7,279,363 | B2 | 10/2007 | Cherukuri et al. |
| 2001/0012725 | A1 | 8/2001 | Maeda et al. |
| 2001/0031548 | A1 | 10/2001 | Elenius et al. |
| 2002/0168798 | A1 | 11/2002 | Glenn et al. |
| 2003/0099085 | A1 | 5/2003 | Duva |
| 2003/0122243 | A1 | 7/2003 | Lee et al. |
| 2003/0209772 | A1 | 11/2003 | Prabhu |
| 2004/0113283 | A1 | 6/2004 | Farnworth et al. |
| 2004/0217446 | A1 | 11/2004 | Headley et al. |
| 2004/0251520 | A1 | 12/2004 | Sasaki et al. |
| 2005/0082651 | A1 | 4/2005 | Farnworth et al. |
| 2005/0085050 | A1 | 4/2005 | Draney et al. |
| 2005/0148160 | A1 | 7/2005 | Farnworth et al. |
| 2006/0068567 | A1 | 3/2006 | Beyne et al. |
| 2006/0076690 | A1 | 4/2006 | Khandros et al. |
| 2006/0278971 | A1 | 12/2006 | Barnes et al. |
| 2008/0303131 | A1* | 12/2008 | McElrea et al. ............... 257/686 |
| 2008/0315407 | A1* | 12/2008 | Andrews et al. ............... 257/735 |

OTHER PUBLICATIONS

International Preliminary Report on Patentability, PCT Application US2008/067541, mailed Jan. 7, 2010.
Office Action mailed Dec. 22, 2006, U.S. Appl. No. 11/016,558.
Amendment filed Jun. 21, 2007 in repsonse to Office Action mailed Dec. 22, 2006, U.S. Appl. No. 11/016,558.
Final Office Action mailed Jul. 19, 2007, U.S. Appl. No. 11/016,558.
Amendment filed Sep. 19, 2007 in response to Final Office Action mailed Jul. 19, 2007, U.S. Appl. No. 11/016,558.
Amendment filed Jan. 22, 2008 in response to Final Office Action mailed Jul. 19, 2007, U.S. Appl. No. 11/016,558.
Office Action mailed Mar. 27, 2008, U.S. Application No. 11/016,558.
Amendement filed Jun. 27, 2008 in response to Office Action mailed Mar. 27, 2008, U.S. Application No. 11/016,558.
Final Office Action mailed Sep. 15, 2008, U.S. Application No. 11/016,558.
Amendment filed Oct. 14, 2008 in response to Final Office Action mailed Sep. 15, 2008, U.S. Application No. 11/016,558.
Office Action mailed Dec. 15, 2008, U.S. Appl. No. 11/016,558.
Amendment filed Apr. 8, 2009 in response to Office Action mailed Dec. 15, 2008, U.S. Appl. No. 11/016,558.
Office Action mailed Jul. 15, 2009, U.S. Application No. 11/016,558.
Amendment filed Aug. 5, 2009 Office Action mailed Jul. 15, 2009, U.S. Appl. No. 11/016,558.
Notice of Allowance mailed Dec. 17, 2009, U.S. Appl. No. 11/016,558.
Office Action mailed Jan. 27, 2009 U.S. Appl. No. 11/849,162.
Amendment filed Mar. 27, 2009 in response to Office Action mailed Jan. 27, 2009 U.S. Appl. No. 11/849,162.
Office Action mailed Jun. 24, 2009 (restriction) U.S. Appl. No. 11/849,162.
Amendment filed Jul. 8, 2009 in response to Office Action mailed Jun. 24, 2009 (restriction) U.S. Appl. No. 11/849,162.
Office Action mailed Oct. 7, 2009 (restriction) U.S. Appl. No. 11/849,162.
Amendment filed Nov. 9, 2009 in response to Office Action mailed Oct. 7, 2009 (restriction) U.S. Appl. No. 11/849,162.
International Search Report for PCT Appl No. US2009/047389, mailed Jan. 14, 2010.
International Search Report for PCT Application No. PCT/US2008/065793, mailed Dec. 22, 2008.
International Search Report for PCT Application No. PCT/US2008/065788, mailed Sep. 30, 2008.
International Search Report for PCT Application No. PCT/US2008/067722, mailed Feb. 25, 2009.
International Search Report for PCT Application No. PCT/US2008/079948, mailed Mar. 17, 2009.
International Search Report mailed Mar. 23, 2009, International Application No. PCT/US2008/74450.
Office Action mailed Jul. 21, 2010 U.S. Appl. No. 11/849,162.

* cited by examiner

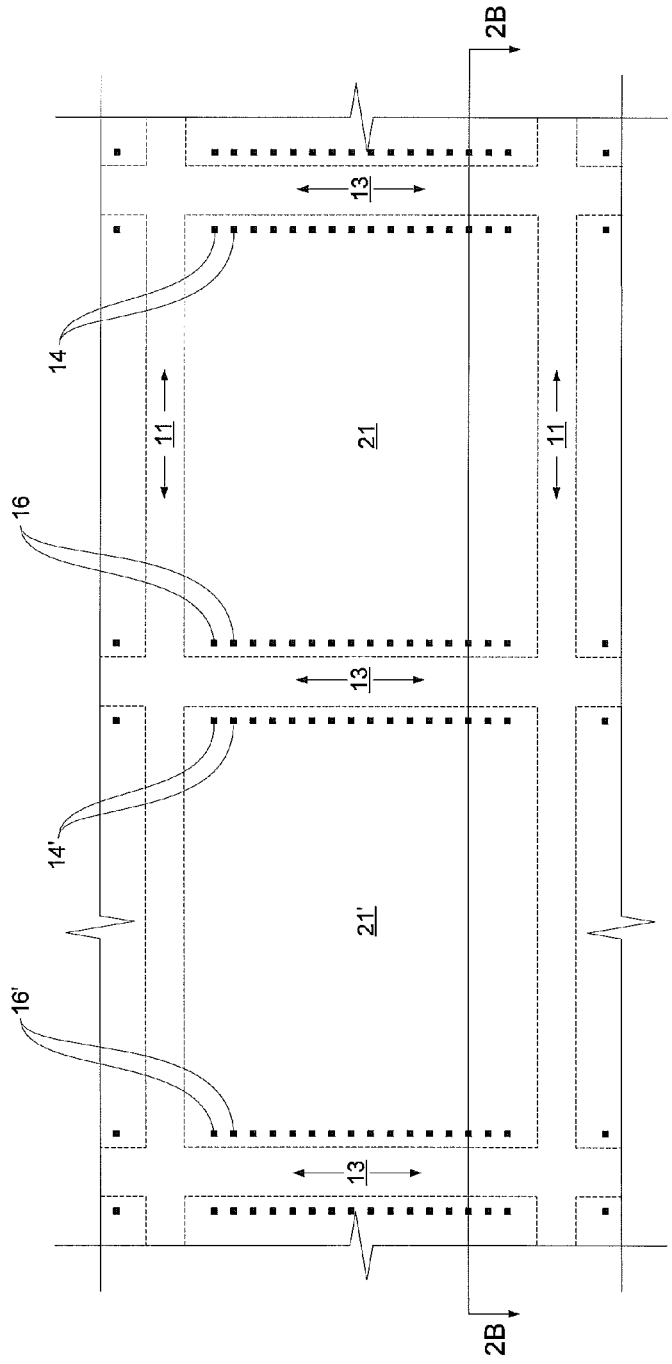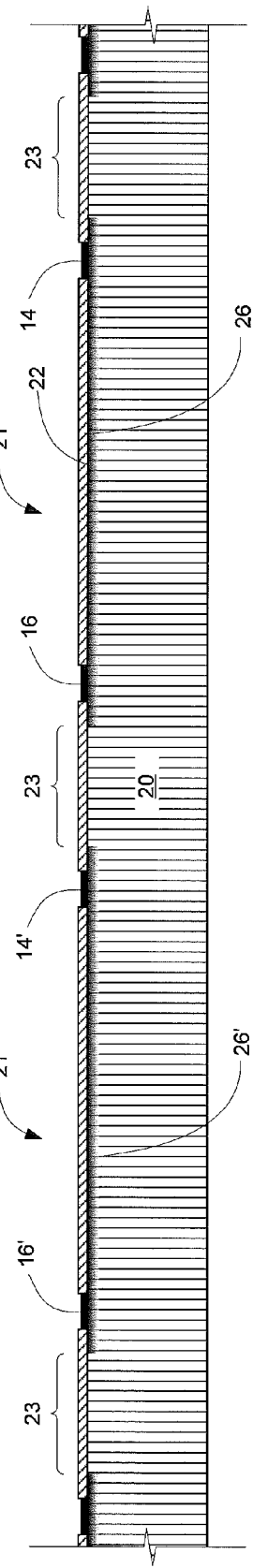
FIG. 2A
FIG. 2B

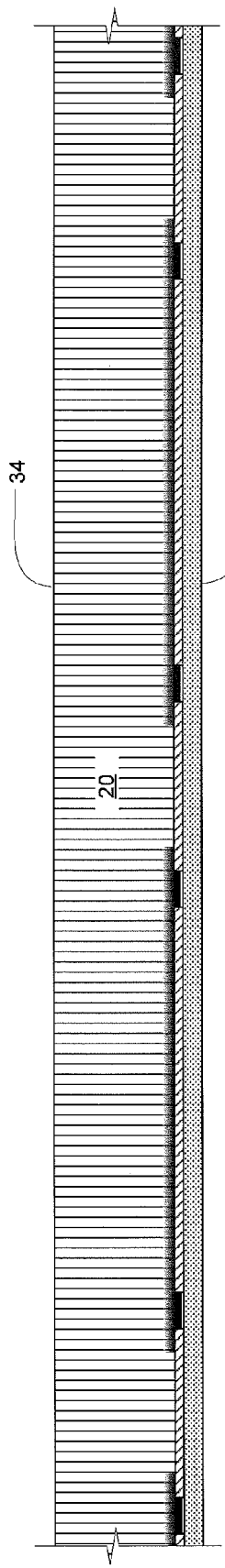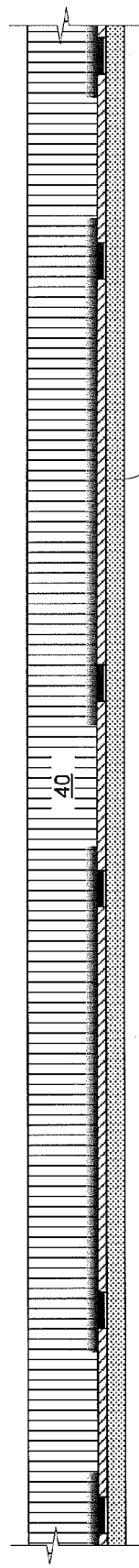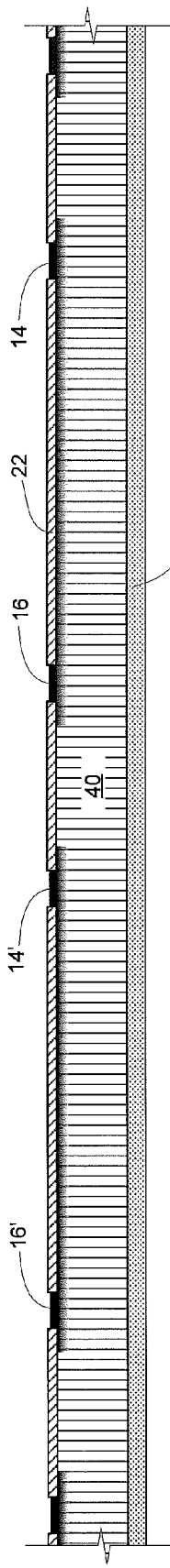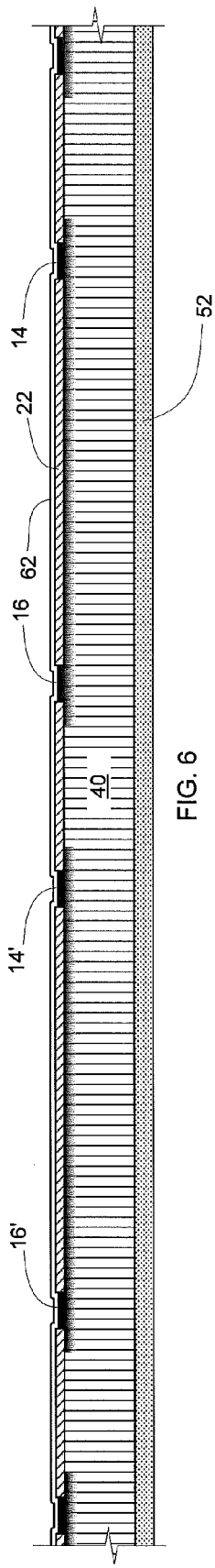

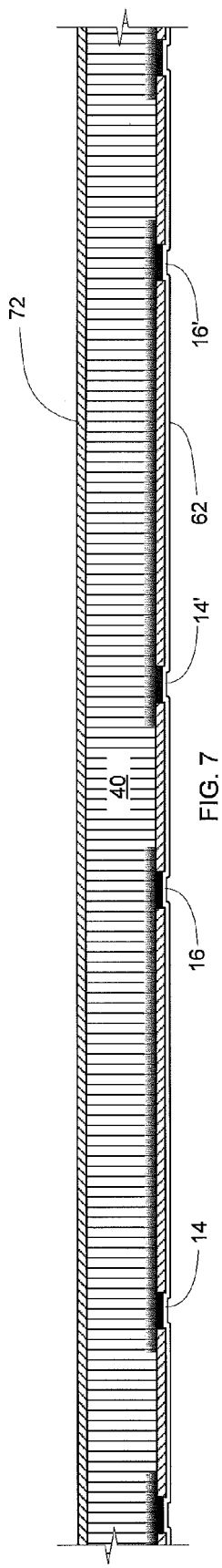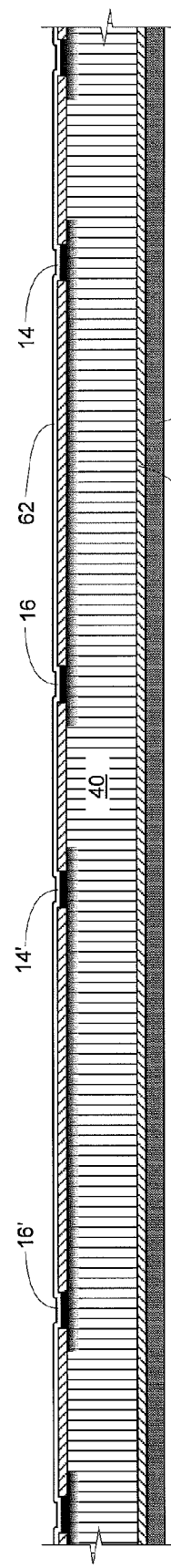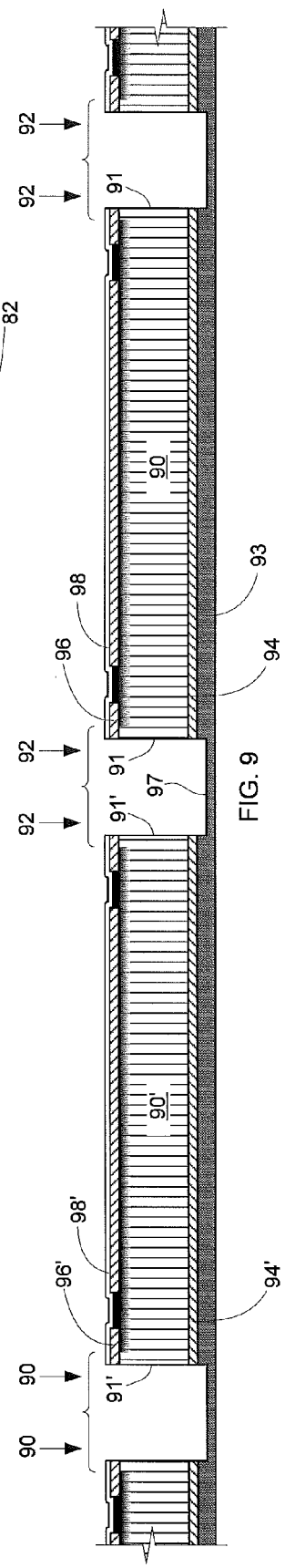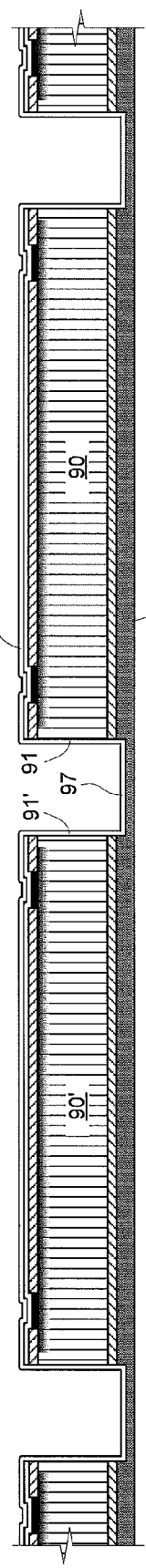

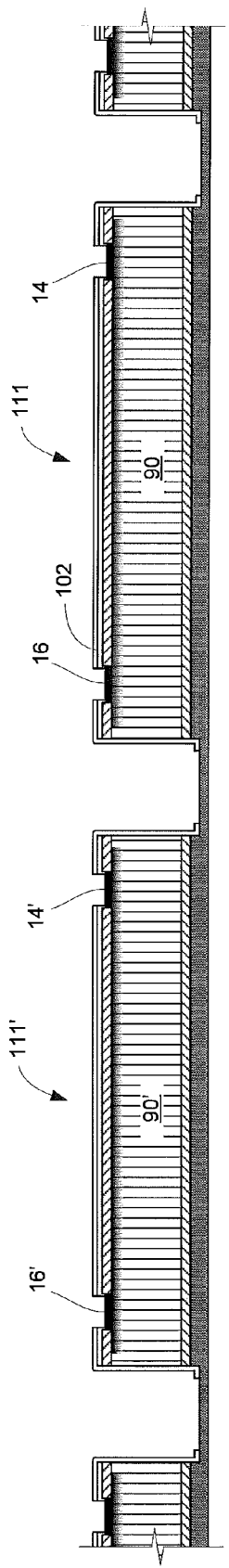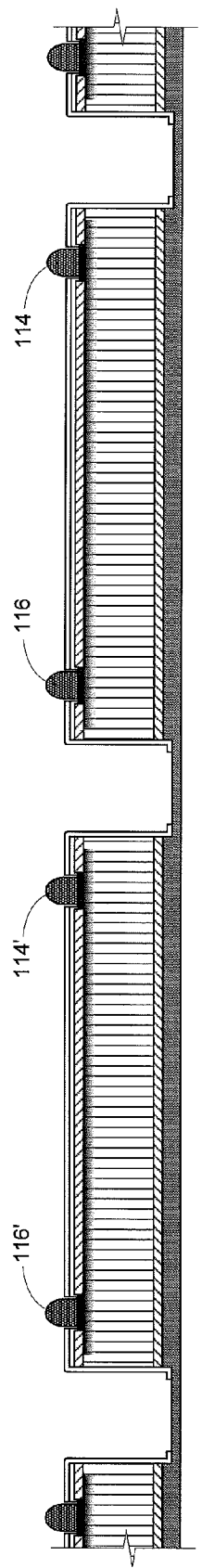

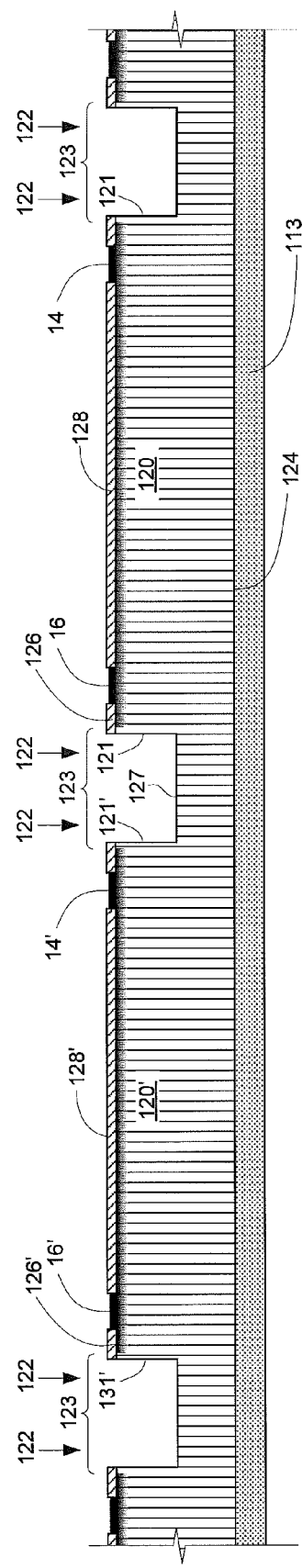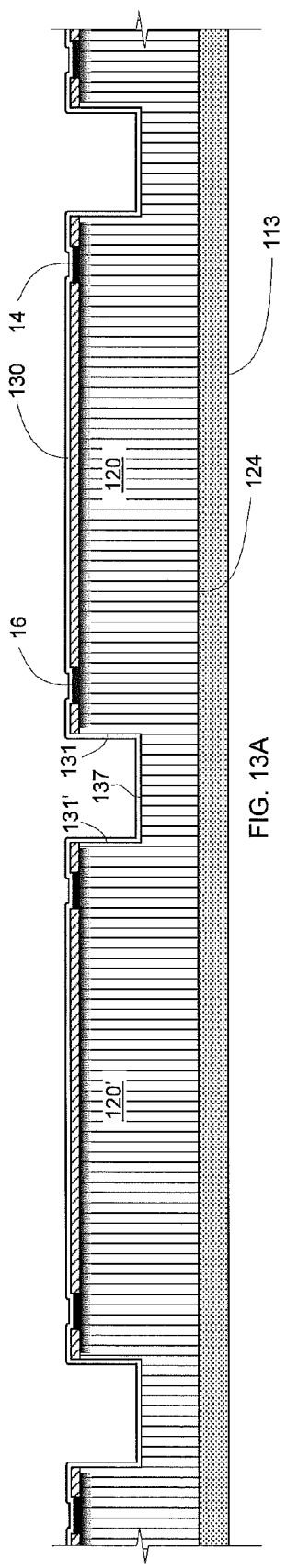

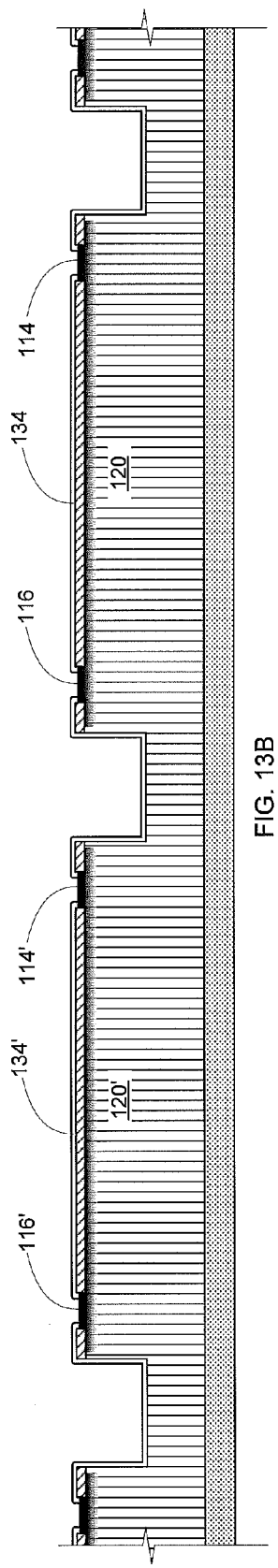
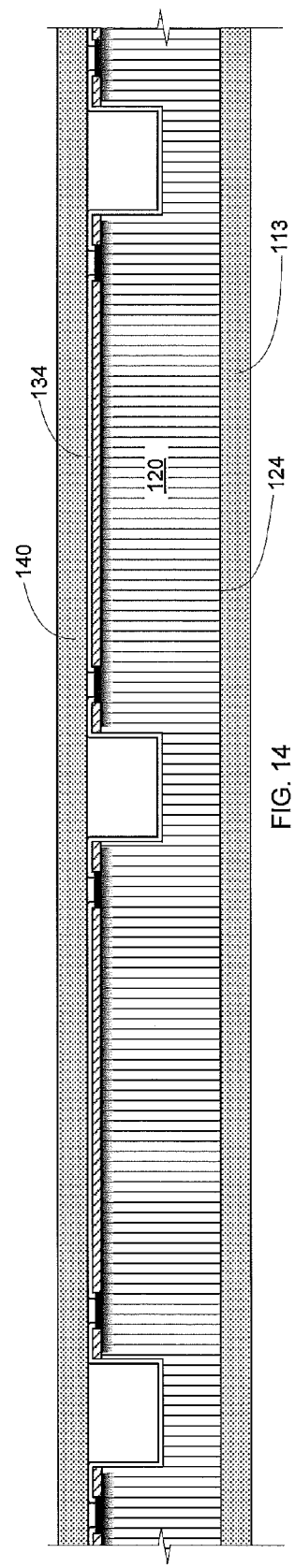

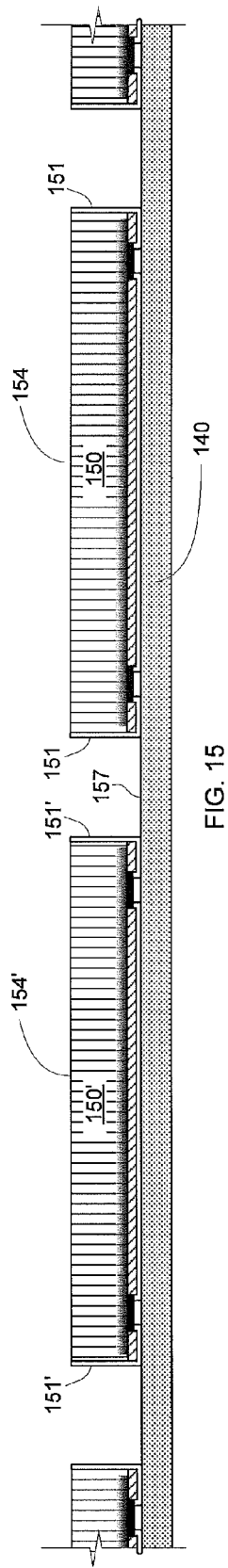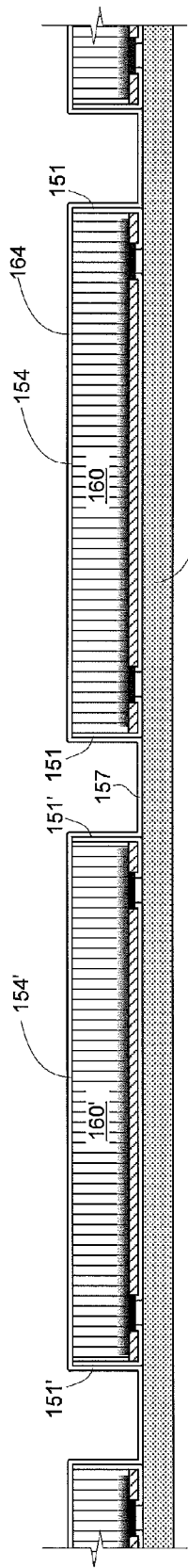

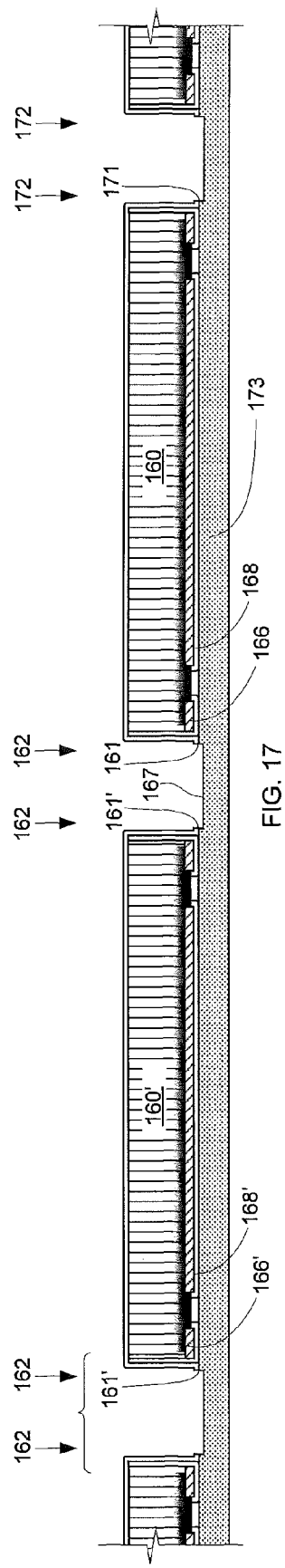
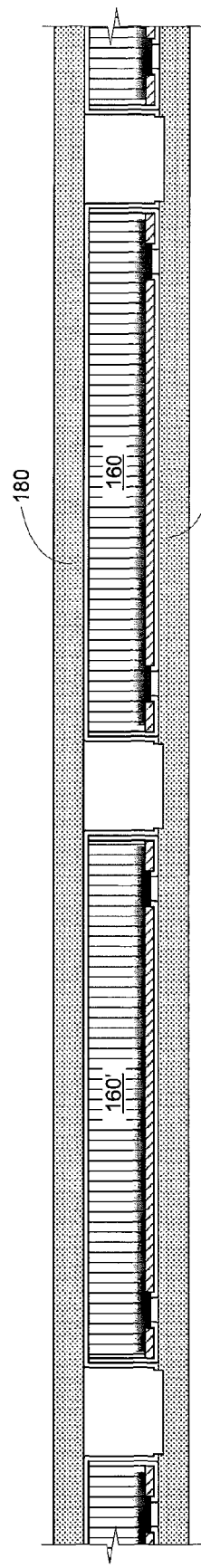
FIG. 17
FIG. 18

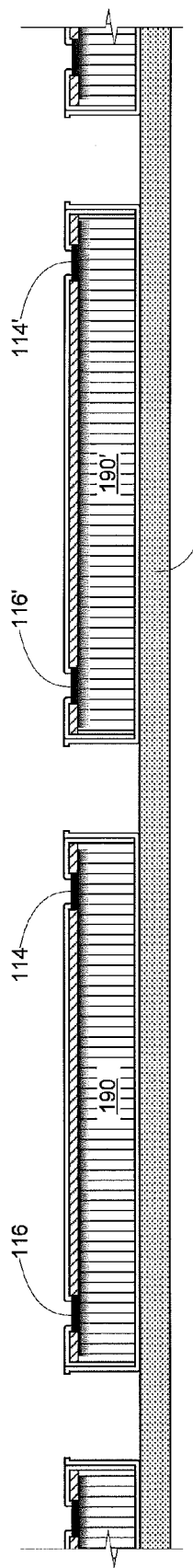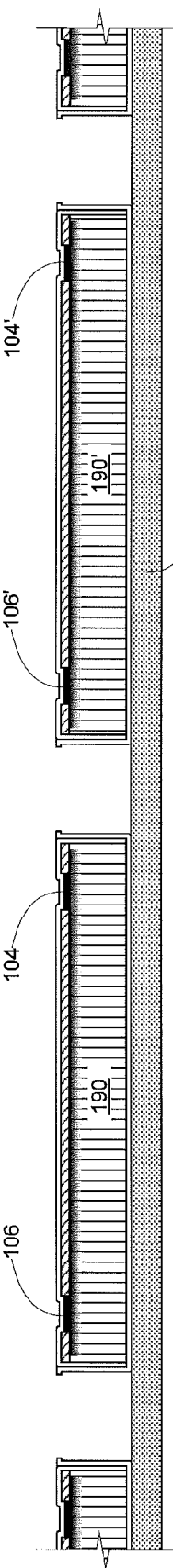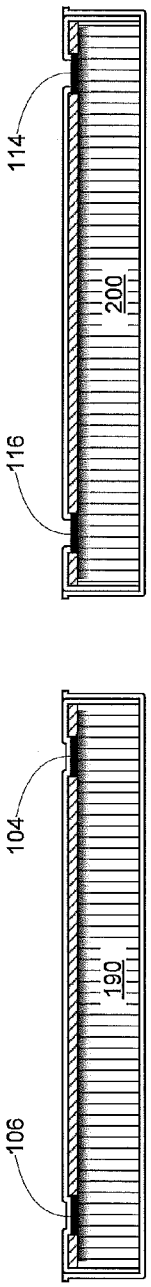

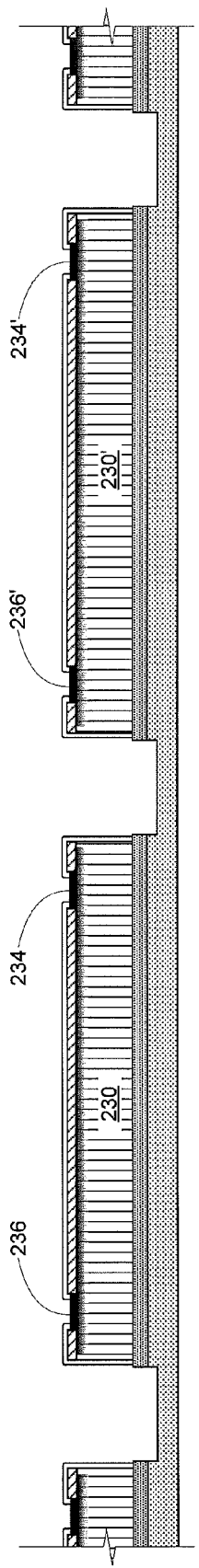
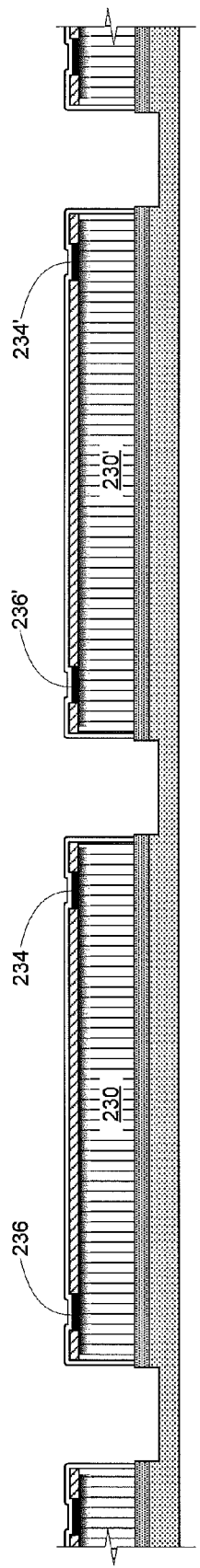
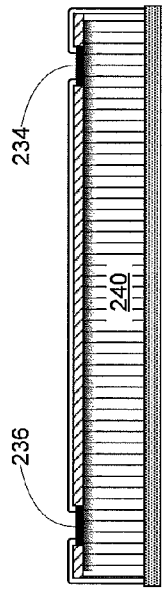
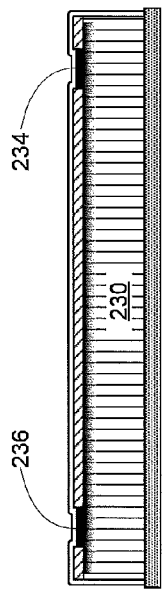
FIG. 23A
FIG. 23B
FIG. 24A
FIG. 24B

WAFER LEVEL SURFACE PASSIVATION OF STACKABLE INTEGRATED CIRCUIT CHIPS

CROSS-REFERENCE TO RELATED APPLICATIONS

This application claims priority in part from S. J. S. McElrea et al. U.S. Provisional Application No. 60/945,005, titled "Wafer level surface passivation of stackable integrated circuit chips", which was filed Jun. 19, 2007; and in part from S. J. Crane et al. U.S. Provisional Application No. 60/956,348, titled "Surface passivation of stackable integrated circuit chips at wafer level", which was filed Aug. 16, 2007.

This application is related to R. Co et al. U.S. Provisional Application No. 61/132,708, titled "Semiconductor die separation method", which is being filed on the same date as this application.

Each patent and patent application referred to herein above or below is hereby incorporated by reference herein.

BACKGROUND

This invention relates to electrical interconnection of integrated circuit chips and, particularly, to stackable integrated circuit devices suited for vertical interconnection.

Interconnection of die with one another in a stack of die ("die-to-die") or of a die or a die stack with a substrate ("die-to-substrate") presents a number of challenges. For example, the integrated circuitry is situated on an "active side" of the die, and exposed pads are situated on the active side of the die for electrical interconnection with other die or with a substrate. When die are stacked, one die in the stack may obscure the pads on another die, making them inaccessible for interconnection, particularly where die having the same or similar dimensions are stacked one over another.

Various kinds of die interconnection have been proposed, including among others flip-chip interconnect, wire bond interconnect, and tab bond interconnect.

Where wire bond interconnect is employed in a stacked die assembly, the wire bonds may be formed to connect pads on the active side of a first die before an additional die is stacked over it. A spacer is typically provided upon the active side of the first die, to prevent interference by the second die with the wire loops on the first die.

Approaches to vertical interconnection of die, other than by wire bonds, bumps, or tabs are described, for example, in U.S. Pat. No. 5,675,180 and its progeny; and, for example, in U.S. Pat. No. 7,215,018 and, for example, in U.S. application Ser. No. 11/097,829.

Particularly, for example, U.S. application Ser. No. 11/097,829 describes "off-die" interconnection, employing interconnection terminals electrically connected to peripheral sites on the die and projecting beyond the die edge; interconnection of the die is made by electrically conductive polymer elements into which the projecting parts of the interconnection terminals extend.

Some die as provided have die pads along one or more of the die margins, and these may be referred to as peripheral pad die. Other die as provided have die pads arranged in one or two rows near the center of the die, and these may be referred to as center pad die. The die may be "rerouted" to provide a suitable arrangement of interconnect pads at or near one or more of the edges of the die.

It can be advantageous to carry out certain processing steps at the wafer level, prior to singulation of the die.

U.S. application Ser. No. 11/016,558 describes methods for providing an electrically insulative conformal coating on all surfaces (active or front side, back side, and sidewalls) of individual singulated semiconductor die.

SUMMARY

In general, according to one aspect, an electrically insulative conformal coating is applied to at least the interconnect margins at the active (front) side and sidewalls of the die during wafer processing. In some embodiments the conformal coating is applied to the entire active side of the die. In some embodiments an electrically insulative conformal coating is applied additionally to the back side of the die. According to one aspect, the wafer is thinned, for example by backgrinding, prior to cutting the wafer to form die sidewalls. According to another aspect, the wafer is cut to form die sidewalls prior to thinning.

In one general aspect (thinning the wafer before cutting) the invention features a method for passivating semiconductor die, the die having interconnect pads arranged in an interconnect margin adjacent interconnect edges, by providing a thinned wafer having an array of chips formed on it; optionally forming a conformal pre-cut passivation over the active side of the wafer; optionally affixing a die attach film over the backside of the wafer; affixing the wafer backside onto a support, cutting the wafer to form die sidewalls and leaving an array of die, or rows of die, in place on the support; and forming a conformal passivation over the array of die or of rows of die, the second passivation constituting a continuous film over the pre-cut passivation at the active side of the die and over the sidewalls of the die. In some embodiments the method further includes forming openings in the pre-cut passivation and the passivation, exposing at least portions of interconnect pads on the die.

In some embodiments the material of the conformal coating includes an organic polymer, for example a polymer of p-xylene or a derivative thereof, such as a polyxylylene polymer, e.g., a parylene C or a parylene N, or a parylene A. In some embodiments the conformal coating is formed by deposition, for example by vapor deposition, or liquid phase deposition, or by solid phase deposition. The material of the conformal coating constituting the passivation may be the same material as, or may be different from, the material of the conformal coating constituting the pre-cut passivation. In some embodiments the conformal coating includes a vapor phase, liquid phase, or B-staged dielectric material, adhesive, or coating of defined thickness. The conformal coating material may be selected to provide for attachment to, for example, a printed circuit board, or other die, or a substrate.

In some embodiments the procedure of forming the conformal coating includes applying a mask or screen over the array, and applying the conformal coating over the mask or screen. The mask when applied reveals areas of the active side to be covered by the conformal coating, and obscures areas not to be covered. The mask or screen is lifted in a later step (for example subsequent to forming the conformal passivation), leaving the conformal coating or coatings in place on the revealed areas.

In embodiments where the wafer is thinned to die thickness before cutting, in saw streets fronted by interconnect margins of the die the wafer is cut entirely through the thinned wafer, so that the die sidewalls along these streets are fully formed through the entire die thickness. Accordingly, when the passivation is formed, the passivation entirely covers the die sidewalls adjacent the interconnect die edges. In saw streets not fronted by interconnect margins of the die, the wafer may optionally (prior to forming the passivation) be cut only partway through the thinned wafer, so that the die are not fully severed at these streets. Where the interconnect margins of the die in the wafer are all arranged along parallel streets running in one direction (the "N-S streets"), the partial cut results in an array of rows of die, in which the die in each row remain partly connected (at the partly cut "E-W streets"), and in which the rows are separated by N-S streets. The blocks or rows of partly-severed die are less likely to shift out of register (die tilt) than fully-singulated die. A later cutting procedure through the semiconductor material of the die completes the separation of the die (die singulation).

In another aspect the invention features an array of semiconductor die or of rows of semiconductor die on a wafer support, the die or rows of die having a passivation constituting a continuous film over at least the interconnect margins at the active side of the die and over the sidewalls of the die. In some embodiments the array of die include openings in the passivation exposing at least portions of interconnect pads on the die. In some embodiments the die or rows of die have a conformal coating over the entire active side of the die.

In another aspect the invention features a semiconductor die having a passivation constituting a continuous film over at least the interconnect margins at the active side of the die and over at least the adjacent sidewalls of the die. In some embodiments the array of die include openings in the passivation exposing at least portions of interconnect pads on the die. In some embodiments the die or rows of die have a conformal coating over the entire active side of the die.

In another general aspect (cutting the wafer before thinning) the invention features a method for passivating semiconductor die, by: affixing a wafer backside onto a first support; cutting the wafer partway through from the active side between the active regions of the chips to form grooves, forming an electrically insulative conformal coating over the surfaces exposed at the front side of the wafer; removing the wafer from the first support and affixing the wafer front side onto a second support; and thinning the wafer to a desired die thickness by removing wafer material from the backside, resulting in an array of die, or rows of die, in place on the second support. The backsides of the die or rows of die in the array are exposed, and each of the die or rows of die in the array has a conformal coating on the active side and the sidewalls.

In some embodiments the procedure of forming the conformal front side coating includes applying a mask or screen over the array, and applying the conformal coating over the mask or screen. The mask when applied reveals areas of the active side to be covered by the conformal coating, and obscures areas not to be covered. The mask or screen is lifted in a later step (for example subsequent to forming a backside conformal passivation), leaving the conformal coating or coatings in place on the revealed areas.

In saw streets fronted by interconnect margins of the die, the wafer is cut to a depth in the wafer at least as great as the prescribed die thickness, so that the sidewalls along these streets are fully formed through the entire die thickness. Accordingly, when the frontside coating is formed, the coating entirely covers the die sidewalls adjacent the interconnect die edges. In saw streets not fronted by interconnect margins of the die, the wafer may optionally (prior to forming the second passivation) be cut only partway through the thickness of the wafer, so that the die are not fully severed during the wafer thinning procedure. Where the interconnect margins of the die in the wafer are all arranged along parallel streets running in one direction (the "N-S streets"), the thinning procedure results in an array of rows of die, in which the die in each row remain partly connected (at the partly cut "E-W streets"), and in which the rows are separated by N-S streets. The blocks or rows of partly-severed die are less likely to shift out of register (die tilt) than fully-singulated die. A later cutting procedure completes the separation of the die (die singulation).

In some embodiments the material of the conformal coating includes an organic polymer, for example a polymer of p-xylene or a derivative thereof, such as a polyxylylene polymer, e.g., a parylene C or a parylene N, or a parylene A. In some embodiments the conformal coating is formed by deposition, for example by vapor deposition, or liquid phase deposition, or by solid phase deposition.

In some embodiments, subsequent to forming the conformal coating over the surfaces at the front side of the wafer, the conformal coating is treated, for example by laser ablation, to expose interconnect pads on the front side for electrical connection. This treatment to expose pads may be carried out prior to affixing the wafer front side onto the second support or prior to thinning the wafer, that is, at the wafer processing level.

In some embodiments an electrically insulative film is applied onto the exposed backsides of the die in the array, and the die are singulated by cutting through the film. Cutting the film may in some embodiments be accomplished by affixing the array of die on a third support such that the film is affixed to the third support; removing the second support; and cutting through the film to the third support. Cutting can be accomplished by, for example, a mechanical technique (sawing, breaking, tearing); or laser cutting or ablation; or water jet cutting; or by a combination of cutting techniques.

In some such embodiments the electrically insulative film includes an adhesive film, such as a die attach adhesive film, a thermal management film, or any film configured as media for attachment to, for example, a printed circuit board, or other die, or a substrate.

In some embodiments, optionally, a second electrically insulative conformal coating is formed over the exposed backside and the coated sidewalls of the die. The second conformal coating may be formed on the array of die or of rows of die. The material of the second conformal coating may be the same material as, or may be different from, the material of the frontside conformal coating. In some embodiments the second conformal coating includes a vapor phase, liquid phase, or B-staged dielectric material, adhesive, or coating of defined thickness. The second conformal coating material may be selected to provide for attachment to, for example, a printed circuit board, or other die, or a substrate.

In some embodiments, subsequent to forming the electrically insulative film or the second electrically insulative second conformal coating, the frontside conformal coating is treated, for example by laser ablation, to expose interconnect pads on the front side for electrical connection; in such embodiments the treatment may be carried out in the array, that is, prior to singulation of the die, or, the treatment may be carried out on singulated die, that is, subsequent to singulating the die.

In another aspect the invention features a method for passivating a semiconductor die, by: affixing a wafer backside onto a first support; cutting the wafer partway through from the active side between the active regions of the chips, forming an electrically insulative conformal coating over the surfaces exposed at the front side of the wafer; removing the wafer from the first support and affixing the wafer front side onto a second support; thinning the wafer to a desired die thickness by removing wafer material from the backside, resulting in an array of die or of rows of die; and optionally forming an electrically insulative second conformal coating over the exposed backside and the coated sidewalls of the die or of the rows of die in the array.

In saw streets fronted by interconnect margins of the die, the wafer is cut to a depth in the wafer at least as great as the prescribed die thickness, so that the sidewalls along these streets are fully formed through the entire die thickness. Accordingly, when the front side coating is formed, the coating entirely covers the die sidewalls adjacent the interconnect die edges. In saw streets not fronted by interconnect margins of the die, the wafer may optionally (prior to forming the second passivation) be cut only partway through the thickness of the wafer, so that the die are not fully severed during the wafer thinning procedure. Where the interconnect margins of the die in the wafer are all arranged along parallel streets running in one direction (the "N-S streets"), the thinning procedure results in an array of rows of die, in which the die in each row remain partly connected (at the partly cut "E-W streets"), and in which the rows are separated by N-S streets. The blocks or rows of partly-severed die are less likely to shift out of register (die tilt) than fully-singulated die. A later cutting procedure completes the separation of the die (die singulation).

In another aspect the invention features a semiconductor wafer, having trenches at the active side between active regions of chips, and having an electrically insulative conformal coating over at least the interconnect margins at the active surface and trench surfaces. In some embodiments the trenches that are fronted by interconnect margins of the die have a depth in the wafer at least as great as the prescribed die thickness, and the trenches that are not fronted by interconnect margins of the die have a depth in the wafer less than the prescribed die thickness.

In another aspect the invention features a semiconductor die having an electrically insulative conformal coating over at least the interconnect margins at the active surface and at least the adjacent sidewalls. In some embodiments the die is one of an array of die. In some embodiments interconnect pads on the die are exposed.

In another aspect the invention features a semiconductor die having an electrically insulative conformal coating over at least the interconnect margins at the active surface and at least the adjacent sidewalls, and having an electrically insulative film over the backside. In some embodiments the die is one of an array of die. In some embodiments interconnect pads on the die are exposed for electrical connection.

In another aspect the invention features a semiconductor die having an electrically insulative conformal coating over at least the interconnect margins at the active surface, at least the adjacent sidewalls, and the backside; the thickness of the conformal coating is greater at the sidewalls than at either the active surface or the backside of the die and, in some embodiments the thickness of the conformal coating at the sidewalls is about the sum of the thickness of the conformal coating at the active surface of the die and the thickness of the conformal coating at the backside of the die.

In some embodiments the semiconductor die has a front side electrically insulative conformal coating over at least the interconnect margins at active surface and at least the adjacent sidewalls of the die, and optionally has an electrically insulative conformal coating over the backside of the die and the frontside conformal coating at the sidewalls. In some embodiments the die is one of an array of die. In some embodiments interconnect pads on the die are exposed.

The methods of the invention can be used to prepare semiconductor die for any of a variety of devices, including for example stacked die assemblies, multiple chip modules, biomedical components, optoelectronics apparatus, MEMS, and vertically interconnected semiconductor assemblies. The devices may be used, for example, for building computers, telecommunications equipment, and consumer and industrial electronics devices.

In another aspect the invention features an assembly including a stack of devices as described above, electrically interconnected die-to-die.

In another aspect the invention features an assembly including a die or a stack of die as described above, electrically interconnected to underlying circuitry (for example in a substrate or a circuit board).

The assemblies according to the invention can be used for building computers, telecommunications equipment, and consumer and industrial electronics devices.

BRIEF DESCRIPTION OF THE DRAWINGS

FIG. 2A is a diagrammatic sketch in a plan view showing a portion of the wafer of FIG. 1A, enlarged, including the area of two adjacent integrated circuit chips.

FIG. 2B is a diagrammatic sketch showing a portion of a wafer of FIG. 1A, including two adjacent integrated circuit chips, as indicated at 2B-2B in FIG. 2A.

FIGS. 3 through 11B are diagrammatic sketches in sectional view as in FIG. 2B, showing stages in an embodiment of a process for forming a surface passivation on the active side and sidewalls of semiconductor die.

FIGS. 12 through 15 are diagrammatic sketches in sectional view as in FIG. 2B, showing stages in an embodiment of a process for forming a surface passivation on the active side and sidewalls of semiconductor die.

FIGS. 16 through 20B are diagrammatic sketches in sectional view showing stages following the stage shown in FIG. 15 in an embodiment of a process for completing a passivated semiconductor die.

FIGS. 21 through 24B are diagrammatic sketches in sectional view showing stages following the stage shown in FIG. 15 in an embodiment of a process for completing a passivated semiconductor die.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention. For example, details of the circuitry within the die are omitted.

Figures 1A, 1B:
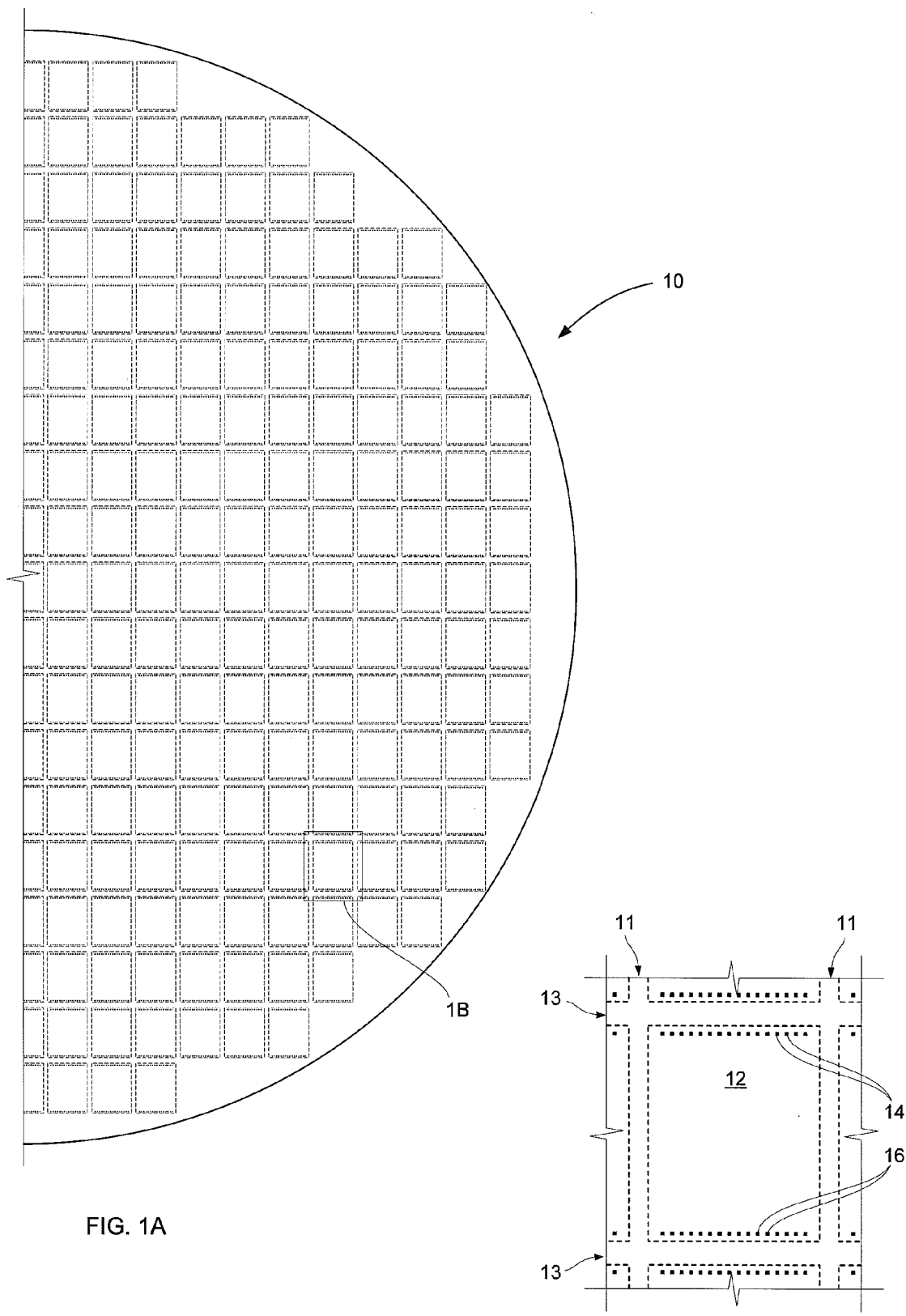
FIG. 1A is a diagrammatic sketch in a plan view showing the circuit side of a one-half portion of a semiconductor wafer.
FIG. 1B is a diagrammatic sketch in a plan view showing a portion of the wafer of FIG. 1A including the area of an integrated circuit chip.

Turning now to FIG. 1A, there is shown in a diagrammatic plan view a half-portion of a semiconductor wafer 10, such as a silicon wafer, with the active side in view. A number of integrated circuit chips are formed on the wafer, one of which is indicated at 1B, and shown in greater detail in FIG. 1B. Referring to FIG. 1B, an active region 12 of a chip is shown, bounded by saw streets 11 and 13. Interconnect pads 14, 16 are arrayed in rows alongside opposite edges of the active region of the chip 12 and, accordingly, the chips shown by way of example in FIGS. 1A, 1B are peripheral-pad chips. FIG. 2A shows two chips 21, 21' next to one another in the wafer as in FIG. 1A, somewhat enlarged; and FIG. 2B shows a sectional view thru a portion of a wafer 20 including chips 21, 21' as indicated at 2B-2B in FIG. 2A. The active regions of the chips are indicated in the active side of the wafer at 26, 26'. An original passivation layer 22 overlies the active regions. Openings in the original passivation layer 22 expose interconnect pads 14, 16 and 14', 16'. Active regions of the respective chips are bounded by saw streets 23.

In the examples shown in the FIGs., the interconnect pads are arranged in rows near two opposite edges of each chip (e.g., rows of pads 14, 16), which may be referred to for convenience as "interconnect edges". The region of the active side of the die adjacent the interconnect edges, in which the rows of interconnect pads are arranged, may be referred to for convenience as the "interconnect margins". Certain of the saw streets in the wafer are fronted by the interconnect edges or margins. In the examples shown in the FIGs., the streets that are fronted by the interconnect edges or margins (e.g., streets 13) all run parallel in one direction, and the streets not fronted by interconnect edges or margins (e.g., streets 11) run parallel in another direction, perpendicular to the first. The streets 13 fronted by interconnect edges or margins may be referred to for convenience as "N-S streets", and the other streets 11 may be referred to for convenience as "E-W streets".

Backgrind Before Cut Process

In one embodiment the wafer is thinned, for example by backgrinding, to a specified die thickness before the wafer is cut along the streets to form the die edges and sidewalls. An example of such an embodiment is illustrated in FIGs.

The wafer 20 is supported by, for example, mounting it as shown in FIG. 3 upon a backgrinding tape 32, with the active (front) side of the wafer toward the tape and the backside 34 of the wafer facing away from the tape. The tape is supported, for example on a wafer ring (not shown in the Figures) and the wafer is thinned by backgrinding, with a resulting thinned wafer 40 as shown in FIG. 4.

In a subsequent procedure, optionally, the thinned wafer 40 is separated from the backgrinding tape 32 and is inverted and supported, for example by mounting it as shown in FIG. 5 on a backing tape or dicing tape 52 with the backside of the thinned wafer toward the dicing tape and the active (front) side of the wafer facing away from the dicing tape so that the interconnect pads 14, 16 and 14', 16' and the original die passivation layer 22 are exposed for further processing. The backing tape or dicing tape 52 can be supported on a wafer ring (not shown in the Figures).

In a subsequent procedure, optionally, a conformal passivation 62 is formed on the active (front) side of the wafer 40, with a result as shown in FIG. 6. The passivation 62 constitutes a continuous film covering the original die passivation 22 and the interconnect pads 14, 16 and 14', 16'. Suitable materials for the passivation 62 include any of a variety of dielectric materials. A parylene may be particularly useful as a passivation. The passivation may be applied by any technique suited to the passivation material. Where a parylene is used, the passivation is formed as a film in a vapor-phase deposition (condensation) and polymerization process. Passivation 62 may be unnecessary; refer to the description of passivation 102, below.

The procedures outlined above with reference to FIGS. 5 and 6 may be omitted. Particularly, conformal passivation 62 is optional, and if it is not employed the procedure outlined with reference to FIG. 6 is unnecessary. As a practical matter if the conformal passivation 62 is omitted, then the procedure outlined with reference to FIG. 5 is also unnecessary. If a passivation is to be used, then the backgrinding tape 32 must be removed from the front side of the wafer prior to application of the conformal passivation 62; otherwise, the backgrinding tape may be removed at a later stage before the cutting procedure is carried out.

In a subsequent procedure the wafer is separated from the backing tape or first dicing tape (if present), and a die attach adhesive film 72 may optionally, if a die attach film is to be employed, be applied to the backside of the wafer 40 as shown in FIG. 7. Thereafter the wafer 40 is supported, for example by mounting it as shown in FIG. 8 on a dicing tape 82 with the die attach adhesive film 72 (if present) toward the dicing tape, and the active (front) side of the wafer and the frontside passivation 62 (where present), facing away from the dicing tape. The dicing tape 82 can be supported on a wafer ring (not shown in the Figures).

In a subsequent dicing procedure the wafer is cut, with a result as shown in FIG. 9. Wafer cutting may be accomplished by cutting along the saw streets, for example using a dicing saw, or a laser, as indicated by arrows 92. The FIGs. illustrate cutting along the streets that are fronted by the interconnect edges of the die, that is, along die edges having pads arranged in adjacent interconnect margins (the N-S streets). In these examples the cutting is carried through all the structures associated with the wafer 40, including the die attach adhesive 72 (if present) and, to ensure that the die attach adhesive is completely severed along the N-S streets, the cutting may be carried to some extent into the second dicing tape as shown by notches 97 in the second dicing tape 93. As may be appreciated, cutting is also carried out along the E-W streets, which do not appear in the sectional views shown here. An array of singulated die results if the cutting along the E-W streets is carried through all the structures associated with the wafer, including the die attach adhesive. Alternatively, as discussed below with reference to FIG. 27, the cutting along the E-W streets may be shallower, not passing through the wafer and consequently resulting in an array of parallel strips of partially severed die. The shallow cutting along the E-W streets may be to a depth significantly less than the die thickness and (although it may be preferred to cut along the E-W streets to a depth at least sufficient to define the die edges) in some embodiments, the shallow cutting along the E-W streets may be omitted altogether (cutting depth approaches or equals zero). The singulated die are left in place affixed to the second dicing tape on the wafer ring; they include semiconductor bodies 90, 90' having die attach films 94, 94' at the back sides and original passivations 96, 96' overlain by optional passivations 98, 98' at the active (front side); and sidewalls 91, 91' constituting the cut surfaces of the die 90, 90'.

In a subsequent process a passivation 102 is formed on the exposed surfaces of the structure shown in FIG. 9, with a result as shown in FIG. 10. Where optionally, as illustrated here, a frontside passivation was formed, passivation 102 constitutes a second passivation. The passivation 102 constitutes a continuous film covering the frontside passivation 98, 98' (if present), the sidewalls 91, 91', and exposed areas 97 of the dicing tape 93. Suitable materials for the passivation 102 include any of a variety of dielectric materials, and may be the same material as the frontside passivation 62 (if present). A parylene may be particularly useful as a passivation. The passivation 102 may be applied by any technique suited to the passivation material. Where a parylene is used, the passivation is formed as a film in a vapor-phase deposition (condensation) and polymerization process.

In a subsequent procedure at least the surface of the interconnect pads 14, 16 and 14', 16' are exposed at least in part by making openings through the frontside passivation 98, 98' (where present) and passivation 102; and a strip of the passivation 102 on the dicing tape is cut along the saw streets, with a result as shown in FIG. 11. Individual die 111, 111' may be separated from the dicing tape at this stage for further treatment by, for example mounting and interconnection on a substrate; or by, for example stacking and die-to-die interconnection. Optionally, the die 111, 111' may be provided with interconnect terminals at the die pads for "off die" interconnection.

Off die interconnection may be made generally as described for example in U.S. application Ser. No. 11/097,829. Alternatively, the interconnect terminals may be dispensed with, by applying a spot of interconnection material at the edge of the die, in contact with a die pad and standing slightly proud of the die sidewall. Or, a metallization may be formed, extending to the die edge, or wrapping around the die edge. Or, terminals may be provided, not projecting beyond the die edge. For example, FIG. 11B illustrates interconnect bumps 114, 116 and 114', 116' electrically connected to peripheral sites (pads) on the die and projecting upward for electrical interconnection. It may be preferred, as shown for illustration in FIG. 11B to mount the interconnect bumps at the wafer level (that is, while the array of singulated die or of rows of die are affixed to the dicing tape; in other embodiments the interconnect terminals may mounted on individual die, following separation from the dicing tape.

The frontside passivation (where present) and second passivation serve to prevent electrical shorting at the active side of the die, and the second passivation serves to prevent electrical shorting at the sidewall. Then the die may be electrically interconnected by applying interconnect material to the sidewall of the die, electrically contacting the portion of the interconnect spot that stands above the passivation or that stands proud of the die edge, and extending to underlying circuitry; or, for die-to-die interconnection, to an interconnect spot on another die in the stack. Or, alternatively, the interconnect spots may be omitted, and the interconnect material may directly contact the pads.

Figure 25A:
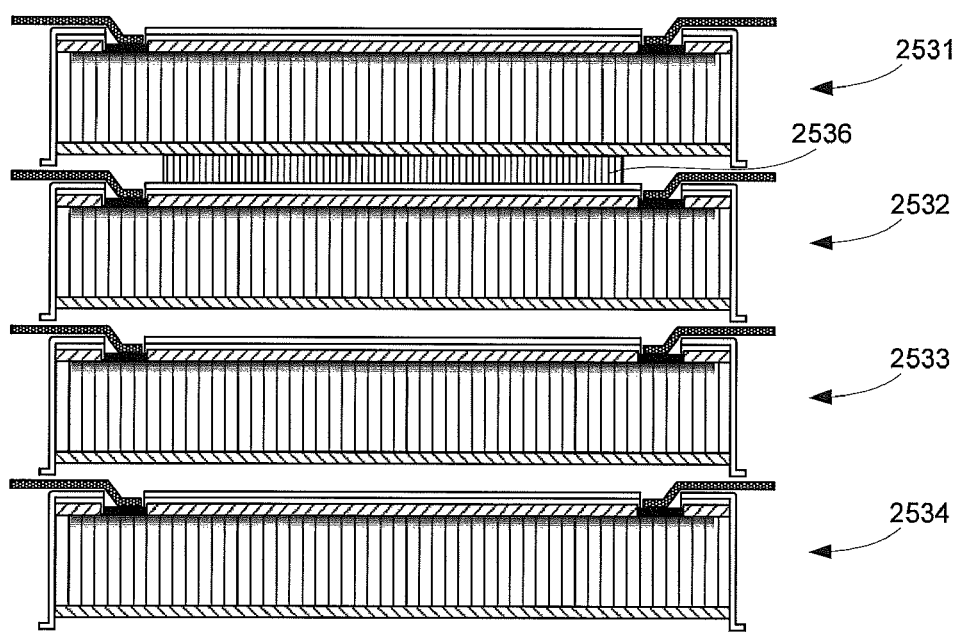
FIG. 25A is a diagrammatic sketch in sectional view showing an assembly of four stacked die passivated according to an embodiment as illustrated in FIGS. 3 through 11, having off-die interconnect terminals.

FIG. 25A shows a vertical stack of four die 2531, 2532, 2533, 2534 arranged for off-die interconnection die-to-die or die-to substrate, for example. The stack may be mounted with the active sides of the die facing toward, or alternatively away from, the mounting surface. Optionally adjacent die in the stack may be held apart by a spacer, such as, for example, a "dummy" die or other suitable spacer. A spacer 2536 is indicated for illustration between the die 2531 and 2532. Alternatively, spacing between die may be provided by using a suitably thick die attach adhesive between adjacent die in the stack.

Figure 25B:
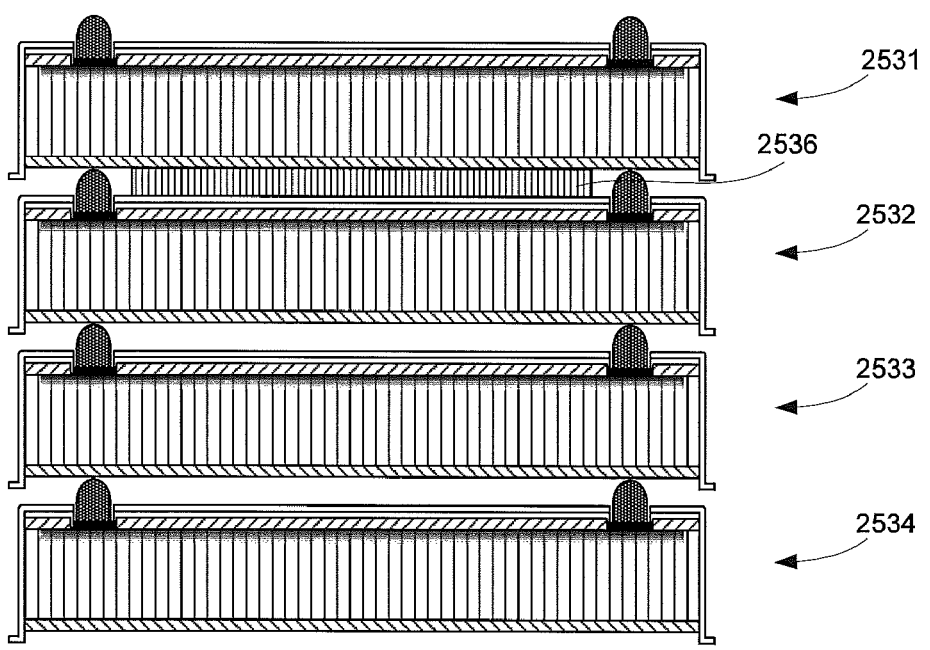
FIG. 25B is a diagrammatic sketch in sectional view showing an assembly of four stacked die passivated according to an embodiment as illustrated in FIGS. 3 through 11B, having interconnect terminals formed as conductive bumps on the interconnect pads.

FIG. 25B shows a vertical stack of four die 2531, 2532, 2533, 2534 provided with interconnect bumps electrically connected to peripheral sites (pads) on the die and projecting upward for electrical interconnection. The die in such a stack may be connected to one another using a curable interconnect material, such as a conductive epoxy, for example; the material is applied in a flowable form at the stack face, and allowed to flow (or forced to flow) between the die so that it makes contact with the bumps. Alternatively, the bumps may be shaped so that they have a portion projecting to the die edge or somewhat proud of the die edge, so that ingress of the interconnect material is not required for good electrical connection with the bump.

Or, interconnection may be made directly on the exposed interconnect sites (pads), in a conventional manner for example by wire binding or tab bonding or by flip chip interconnection. Stacked die may be spaced apart to allow for interconnection. Or, the die may be stacked in an offset or staggered manner, such that at least a portion of the interconnect sites (pads) on lower die are not obscured by die stacked over them, and therefore are available for interconnection. In some embodiments interconnection may be made by traces of conductive material applied in a flowable form and thereafter cured or hardened.

Various die interconnect configurations and die stacking arrangements are described, for example, in S. J. S. McElrea et al. U.S. application Ser. No. 12/124,077, titled "Electrically interconnected stacked die assemblies", which was filed May 20, 2008; and procedures for interconnecting die using curable electrically conductive materials are described, for example, in T. Caskey et al. U.S. application Ser. No. 12/124, 097, titled "Electrical interconnection formed by pulsed dispense", which was filed May 20, 2008. Each of the cited applications is hereby incorporated herein by reference herein.

Cut Before Backgrind Process

In a first phase of an example of an embodiment of a process in which the wafer is sawn at least partly before backgrinding, illustrated by way of example in FIGS. 12 through 15, a conformal electrically insulative covering is formed at a wafer processing level on the active sides and on the sidewalls of the chips.

Referring now to FIG. 12, the wafer provided as described generally above with reference to FIG. 2B is mounted for support, for example on a dicing film or dicing tape, and then the wafer is scribed; that is, it is cut partway through from the active side between the active regions of the chips. FIG. 12 shows a wafer supported on a dicing film, with the backside 124 of the wafer in contact with the dicing film 113. Trenches are formed in the saw streets 123 using a cutter such as a saw (a dicing saw, for example) or a laser trenching tool as indicated by arrows 122. The trenches are cut through the original passivation layer 22 and part of the semiconductor material of the wafer to a depth at the trench floors 127 that exceeds the eventual thickness of the die to be singulated from the wafer; the trenches may be cut to a depth about 20% greater than the eventual die thickness, for example. The walls 121, 121' of the trenches define the sidewalls of the respective die regions 120, 120' of the wafer. In the examples shown here the circuitry in the active side of the wafer is covered by residual central portions 128, 128' and marginal portions 126, 126' of the original passivation.

The wafer as provided may have any thickness; a typical wafer may have a nominal thickness about 30 mils, or about 700 um. The finished die may in some embodiments have a thickness in a range about 20 um to about 250 um; and the depth of the trenches will be determined according to the desired finished die thickness. In some embodiments, for example, the finished die may have a "standard" thickness, in a range about 120 um to about 250 um; or it may be "thin", having a thickness in a range about 80 um to about 120 um; or it may be "ultra thin", having a thickness in a range about 20 um to about 80 um.

In a subsequent procedure a conformal dielectric coating is formed on the surfaces exposed at the front side of the scribed wafer, including: the residual portions 128, 128' of the original passivation, the die pads 14, 16, and 14', 16', and the trench floors 127 and trench walls 121, 121'. FIG. 13A shows a resulting construct. The material of the conformal coating 130 may be any of a variety of dielectric materials; suitable materials include organic polymers, for example a polymer of p-xylene or a derivative thereof, such as a polyxylylene polymer, e.g., a parylene C or a parylene N, or a parylene A.

The conformal coating may be formed by vapor deposition, liquid phase deposition, or solid phase deposition, for example. Particular conformal coating materials include parylenes, for example, such as parylene C, parylene N, and parylene A; and such materials may be deposited by vapor phase deposition, for example. The conformal coating is formed to a thickness at least sufficient to ensure that it has no openings through to the underlying surface; typically the thickness of the conformal coating may be in a range about 1 um to about 50 um. In particular embodiments where the conformal coating is a vapor deposited parylene, for example, the conformal coating may be applied at a rate about 10 Å per second, to a thickness in a range about 0.1 nm to about 50 um, for example in a range about 1 um to about 15 um. The term "conformal" in this context means that the thickness of the coating is substantially uniform over the broader coated surfaces. Some "fill" may be expected in the conformal coating, particularly where the coating forms in narrow spaces or in acutely concave features on the surface. Generally, the conformal coating is applied to a thickness sufficient to ensure protection of the die edge where the conformal coating passes over the die edge (which may present an abrupt right angle). The coating "conforms" to the underlying surface, that is, some contours in the underlying surface show also in the surface of the conformal coating; generally, the contours of a sharply-defined underlying feature may be expected to show in a corresponding contour if the feature is at least as high as the thickness of the coating itself.

The wafer as provided may have exposed at the active side one or more layers such as interconnect pads; a redistribution layer, including rerouting circuitry; silicon; or polyimide or other polymer passivation. In some embodiments a plasma clean is performed prior to forming the conformal dielectric coating, to enhance adhesion of the conformal coating material to the surfaces.

As noted above, the die pads are covered by the conformal coating over the active surface. At some stage pads that are to be employed for electrical interconnection of the die must be exposed. Treatment to expose pads, for example by laser ablation of the overlying conformal coating, may be carried at any of several stages, such as at a wafer processing stage, with a result as illustrated in FIG. 13B. FIG. 13B shows a result of exposing pads 114, 116 on chip region 120, and pads 114', 116' over chip region 120', for example, and leaving the conformal coating 134, 134' over the active surface of the die 120, 120' and the surfaces of the trenches. Alternatively the pads may be exposed at any subsequent stage in which the conformal coating is exposed for treatment, and may be carried out at a wafer processing stage; or, as discussed below, at a die array processing stage with a result as illustrated in FIG. 19A, or on singulated die subsequent to singulation, as illustrated in FIGS. 20A, 20B.

In a subsequent procedure a second support is applied over the conformal coating at the active side of the wafer, as shown in FIG. 14. The support, which may be for example a backgrinding film or tape 140, is affixed onto the conformal coating 134, 134' overlying the chips 120, 120'. The first support (dicing tape) 113 is removed to expose the backside 124 of the wafer, and the wafer is thinned, for example by backgrinding, to the desired die thickness, as shown in FIG. 15. The first support may be removed either before or after the second support is applied, although application of the second support may be facilitated by keeping the wafer affixed to the first support until application of the second support is completed. Preferably the first support is removed prior to backgrinding.

As FIG. 15 shows, backgrinding to the desired die thickness results in separation of the die 150, 150' along the streets that are fronted by the interconnect edges or margins, while leaving the die substantially in place in an array on the second support. Following backgrinding and singulation the backside of each die 150, 150' in the array is exposed, as shown at 154, 154', and each die in the array has a conformal coating over the active (circuit) side and over the die sidewalls, as shown at 151, 151'.

The FIGs. illustrate cutting along the streets that are fronted by the interconnect edges of the die, that is, along die edges having pads arranged in adjacent interconnect margins (the N-S streets). As may be appreciated, cutting is also carried out along the E-W streets, which do not appear in the sectional views shown here. As noted above, in these examples in first cutting operation the cutting along the N-S streets is carried to a depth at least as great as the eventual die thickness. An array of singulated die results from the first cutting operation if the cutting along the E-W streets is also carried to a depth at least as great as the eventual die thickness, because when the wafer is thinned by removing material from the wafer backside to the eventual die thickness, no material remains at either the N-S streets or the E-W streets. Alternatively, as discussed below with reference to FIGS. 28 and 29, in the first cutting operation the cutting along the E-W streets may be shallower, passing to a depth less than the eventual die thickness; as a consequence, the wafer thinning results in an array of parallel strips or rows of partially severed die. The shallow cutting along the E-W streets may be to a depth significantly less than the die thickness and (although it may be preferred to cut along the E-W streets to a depth at least sufficient to define the die edges) in some embodiments, the shallow cutting along the E-W streets may be omitted altogether (cutting depth approaches or equals zero).

According to alternate embodiments, treatment of the backside of the die can following the stage shown in FIG. 15 proceed in any of a variety of ways. Two are shown here, for illustration, both carried out at the die array or die row array processing level. In one such treatment of the backside of the die, illustrated by way of example in FIGS. 16 through 20B, a second conformal electrically insulative covering is formed on the die array over the backside of the die and over the coated die sidewalls. In another such treatment, illustrated by way of example in FIGS. 21 through 24B, a dielectric film is applied in the die array over the backside of the die.

FIG. 16 shows a die array as in FIG. 15 following formation of an optional backside conformal coating over the exposed surfaces of the die array on the second support. The backside conformal coating 164, 164' covers the back side 154, 154', and the coated sidewalls 151, 151' of the die 160, 160', as well as the areas 157 of the second support 140 between the die.

The material of the optional second conformal coating may be any of a variety of dielectric materials; suitable materials include organic polymers, for example. The conformal coating may be formed by vapor deposition, liquid phase deposition, or solid phase deposition, for example. Particular conformal coating materials include polymers of p-xylene or a derivative thereof, for example, such as a polyxylylene polymer, e.g., a parylene C or a parylene N, or a parylene A. In some embodiments the conformal coating is formed by deposition, for example by vapor deposition, or liquid phase deposition, or by solid phase deposition.

The conformal coating is formed to a thickness at least sufficient to ensure that it has no openings through to the underlying surface; typically the thickness of the conformal coating may be in a range about 0.1 um to about 50 um. In particular embodiments where the conformal coating is a vapor deposited parylene, for example, the conformal coating may be applied at a rate about 10 Å per second, to a thickness in a range about 1 um to about 15 um, for example.

The conformal coatings may be formed of the same material, or a different material.

In some embodiments, as for the frontside conformal coating, a plasma clean is performed prior to forming the optional backside conformal dielectric coating, to enhance adhesion of the conformal coating material to the surfaces.

In a subsequent procedure, portions of the conformal coating at the second support are cut in the saw streets adjacent the die in the array. FIG. 17 shows a resulting die array. This is accomplished using a cutter such as a saw (a dicing saw, for example) or a laser trenching tool as indicated in FIG. 17 by arrows 162. A narrower tool is employed than was used to cut the die. The cut may be carried out as close as is practicable to the sidewalls of the die, so as to minimize the amount of the backside conformal coating that remains as a tag 161, 161' near the die edge. The cut may be stopped at the surface of the support (backgrind tape), so long as removal or severing of the conformal coating between the die is sufficiently complete. Or, the cut may be continued some way into the support 173, as shown at 167 by way of example in FIG. 17, to ensure complete removal or severing of the conformal coating between the die. In either event, as will be appreciated, it is not necessary that all the material in the zone of the saw streets be removed; severing of the coating adjacent the die, sufficient to allow removal of the singulated die subsequently, is desired.

In a subsequent procedure, a third support can be applied onto the second conformal coating at the array backside, with a result as shown by way of example in FIG. 18. The third support, which may be a film frame tape 180, for example, is shown affixed to the backsides of the covered die 160, 160' in the array. Thereafter the second support 173 is removed from the die array, as shown by way of example in FIG. 19A. The die array, now supported by the third support (film frame tape) 180, presents the front (active) sides of the fully covered die 190, 190' for further processing. The die may, for example, be removed from the support and handled separately (for example using a pick-and-place tool, not shown in the FIGs.), as suggested in FIG. 20A; or, additional processing may be carried out at the array level.

Eventually, as noted above with reference to FIGS. 13A, 13B, for electrical interconnection of the die to other circuitry, openings will be formed through the conformal coating to underlying interconnect pads. The openings may as a practical matter be formed at any stage in the process. The openings may be formed for example prior to wafer thinning, at a stage as illustrated in FIG. 13A and prior to a stage as illustrated in FIG. 14; or, for example, in the die array following singulation of the die and prior to removal of the die from the array, at a stage as illustrated in FIG. 19B (also in FIG. 23B); or, for example, following removal of the die from the array, and just prior to interconnection of the die, as illustrated in FIGS. 20A, 20B (also in FIGS. 24A, 24B). As shown in FIG. 19B, if the openings in the conformal coating were not made earlier, the interconnect pads 104, 106 and 104', 106' on the die 190, 190' are covered by the conformal coating (unless, optionally, the material over the pads had been removed at an earlier stage.) The openings are formed by a technique that can effectively expose at least a portion of the area of the interconnect pad without excessively damaging the pad. Particular appropriate techniques include laser ablation, for example; in some embodiments the laser is operated at a wavelength and at a power level and for a duration sufficient to remove the coating material without unduly damaging the underlying pad. In some embodiments, for example, where the conformal coating material is a parylene, the laser ablation can be carried out for example using a pulsed excimer laser operating at 248 nm, directed onto the conformal coating in an area overlying the pad to be exposed. In some embodiments not all the pads on a die are treated to be exposed; selected pads may in a particular deployment of a die be left covered by the electrically insulative coating.

FIG. 20A shows a die 190 having a conformal coating on all surfaces: the active side of the die (covered by part of the frontside conformal coating, where present), the backside of the die (covered by part of the second conformal coating), and the sidewalls (covered, where a frontside coating is present by overlapping parts of the frontside coating and the second conformal coating). Such a die would result from carrying out processing procedures as described with reference to FIGS. 14 through 19B, beginning with a trenched and coated wafer in a stage as shown for example in FIG. 13A.

As shown in FIG. 20A, the areas of the conformal coating overlying the interconnect pads 104, 106 have not yet been removed. FIG. 20B shows a finished die 200 having interconnect pads 114, 116 exposed for electrical interconnection.

Figure 21:
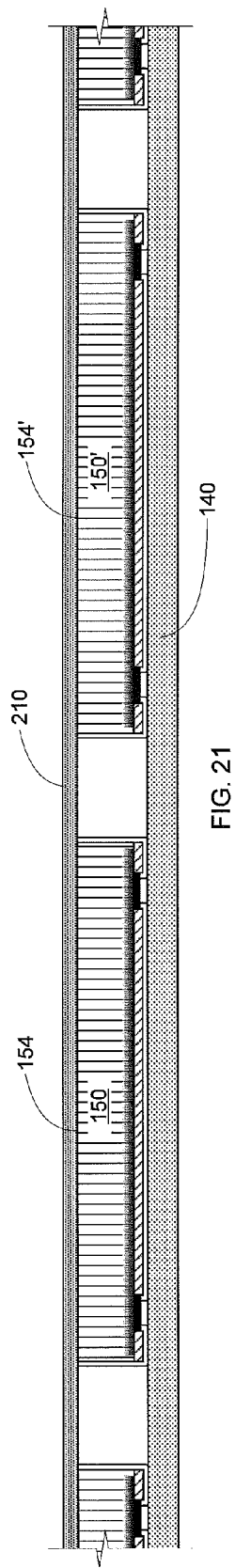

FIG. 21 shows a die array as in FIG. 15 following application of a dielectric film 210 over the exposed backsides 154, 154' of the die 150, 150' in the array on the second support 140. The dielectric film 210 may be adhesive, so that it adheres upon contact (or under pressure, or by application of heat or light, for example) with the die backside surfaces; and it may be, for example, a die attach film adhesive.

Figure 22:
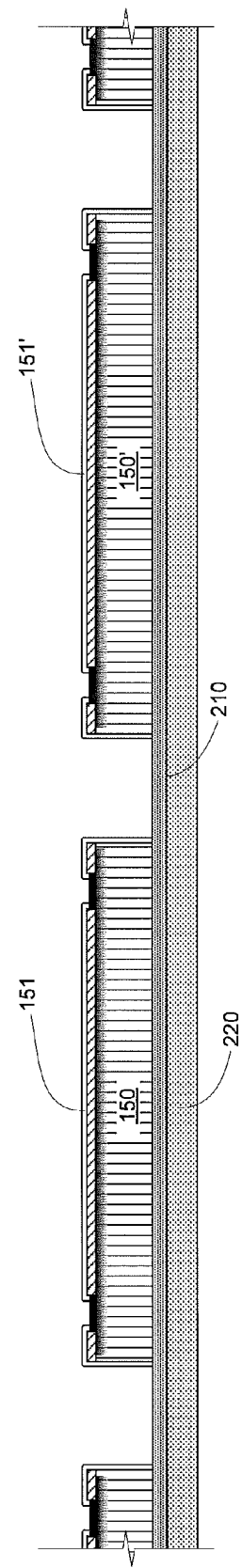

In a subsequent procedure the die array is affixed to a third support (which may be, for example a backing tape), and the second support is removed, with a result as shown by way of example in FIG. 22. The dielectric film 210 is affixed to the third support (backing tape) 220, and the surfaces of the die 150, 150' that are covered by the first conformal coating 151, 151' are exposed for further processing.

In a subsequent procedure, portions of the dielectric film at the third support are cut in the saw streets adjacent the die in the array. FIG. 23A shows a resulting die array. This is accomplished using a cutter such as a saw (a dicing saw, for example) or a laser trenching tool. The cut may be stopped at the surface of the third support, so long as removal or severing of the dielectric film adjacent the die is sufficiently complete. Or, the cut may be continued some way into the support, as shown by way of example in FIG. 23A. In either event, as will be appreciated, it is not necessary that all the material in the zone of the saw streets be removed.

As shown in FIG. 23B, where the first conformal coating is not treated for selective removal over die pads, the interconnect pads 234, 236 and 234', 236' on the die 230, 230' are covered by the first conformal coating. Eventually, as noted above with reference to FIGS. 13A, 13B, and with reference to FIGS. 19A, 19B, for electrical interconnection of the die to other circuitry, openings will be formed through the conformal coating to underlying interconnect pads. The openings may as a practical matter have been formed at an earlier stage in the process. The openings may have been formed for example prior to wafer thinning, at a stage as illustrated in FIG. 13A and prior to a stage as illustrated in FIG. 14. Or, for example, the openings may have been formed in the die array following singulation of the die and prior to removal of the die from the array, at a stage as illustrated in FIG. 23B. Or, for example, the openings may be formed later, following removal of the die from the array, and just prior to interconnection of the die, as illustrated in FIGS. 24A, 24B. The openings are formed by a technique that can effectively expose at least a portion of the area of the interconnect pad without excessively damaging the pad. Particular appropriate techniques include laser ablation, for example; in some embodiments the laser is operated at a wavelength and at a power level and for a duration sufficient to remove the coating material without unduly damaging the underlying pad. In some embodiments, where the conformal coating material is a parylene, the laser ablation can be carried out using a pulsed excimer laser operating at 248 nm, directed onto the conformal coating in an area overlying the pad to be exposed. In some embodiments not all the pads on a die are treated to be exposed; selected pads may in a particular deployment of a die be left covered by the electrically insulative coating.

FIG. 24A shows a die 230 having a conformal coating on all surfaces: the active side of the die (covered by part of the first conformal coating), the backside of the die (covered by part of the dielectric film), and the sidewalls (covered by part of the first conformal coating). Such a die would result from carrying out processing procedures as described with reference to FIGS. 21 through 23B, beginning with a trenched and coated wafer in a stage as shown for example in FIG. 13A. As shown here, the areas of the conformal coating overlying the interconnect pads 234, 236 have not yet been removed. FIG. 24B shows a finished die 240 having interconnect pads 234, 236 exposed for electrical interconnection.

Die prepared as described here may be electrically interconnected with other circuitry (such as other die, or a substrate, or a circuit board, or a leadframe, or an interposer, for example) by any of a variety of interconnects, including, for example, wire bonding, flip chip, tab, pin, vertical interconnection; and employing any of a variety of materials, such as, for example, conductive polymers, conductive epoxies.

Figure 26A:
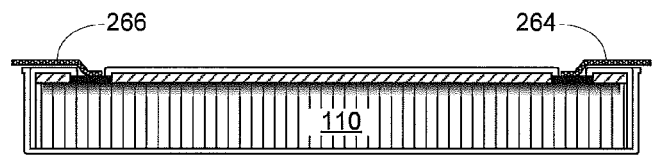
FIG. 26A is a diagrammatic sketch in sectional view showing a die passivated according to an embodiment as illustrated in FIGS. 12 through 20B, having off-die terminals.
Figure 26B:
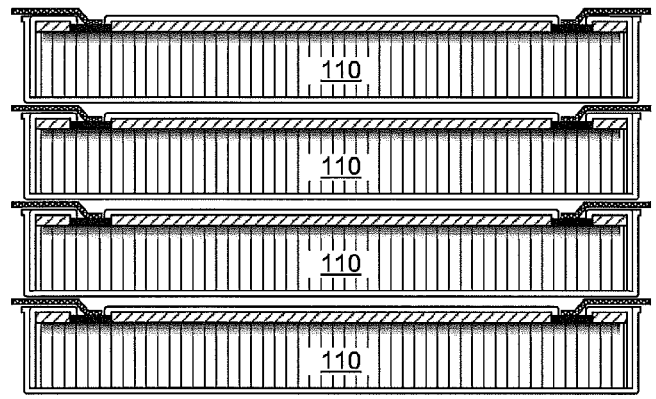
FIG. 26B is a diagrammatic sketch in sectional view showing an assembly of four stacked die passivated according to an embodiment as illustrated in FIGS. 12 through 20B, having off-die interconnect terminals.

FIG. 26A shows by way of example an interconnect-ready die as in FIG. 11B, provided with off-die interconnect terminals 264, 266; and FIG. 26B shows by way of example a die stack constructed of four such interconnect-ready die, for vertical interconnection.

Figure 26C:
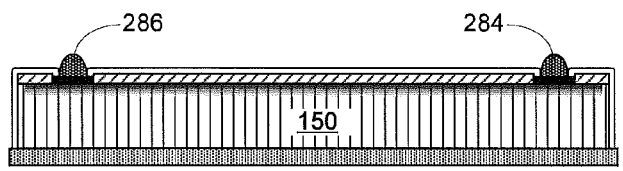
FIG. 26C is a diagrammatic sketch in sectional view showing a die passivated according to an embodiment as illustrated in FIGS. 12 through 15 and 21 through 24B, having interconnect terminals formed as conductive bumps on the interconnect pads.
Figure 26D:
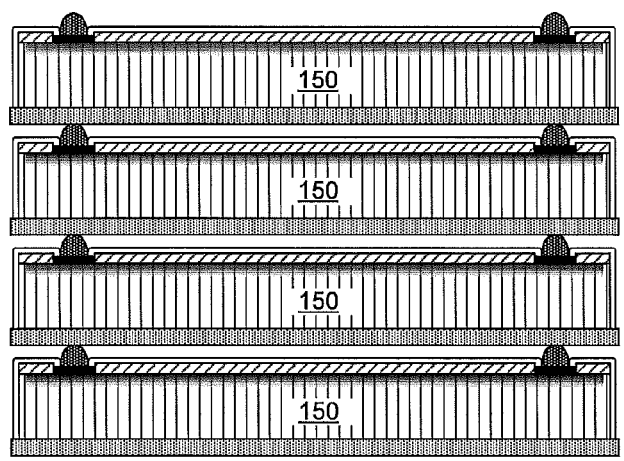
FIG. 26D is a diagrammatic sketch in sectional view showing an assembly of four stacked die passivated according to an embodiment as illustrated in FIGS. 12 through 15 and 21 through 24B, having interconnect terminals formed as conductive bumps on the interconnect pads.

FIG. 26C shows by way of example an interconnect-ready die as in FIG. 15B, provided with interconnect terminals 284, 286; and FIG. 26D shows by way of example a vertical stack of four die provided with interconnect bumps electrically connected to peripheral sites (pads) on the die and projecting upward for electrical interconnection. The die in such a stack may be connected to one another using a curable interconnect material, such as a conductive epoxy, for example; the material is applied in a flowable form at the stack face, and allowed to flow (or forced to flow) between the die so that it makes contact with the bumps. Alternatively, the bumps may be shaped so that they have a portion projecting to the die edge or somewhat proud of the die edge, so that ingress of the interconnect material is not required for good electrical connection with the bump.

Figure 27:
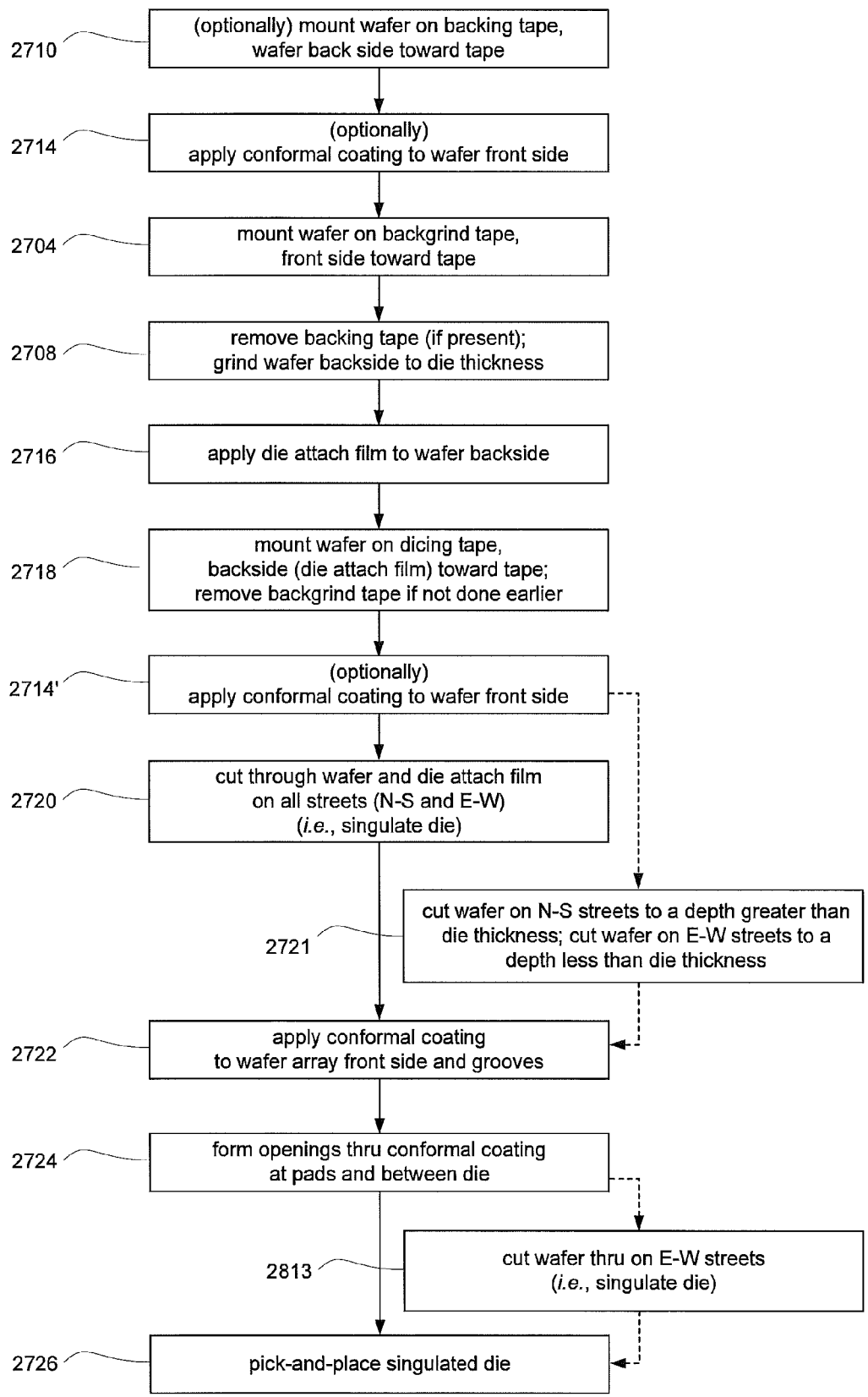
FIG. 27 is a flow diagram showing stages in an embodiment of a process for making a passivated die, as outlined generally above with reference to FIGS. 3 through 11A.

FIG. 27 is a flow diagram showing a sequence of stages in a process for making a passivated semiconductor die according to an embodiment of the invention. In this embodiment the wafer is thinned to the eventual die thickness prior to cutting to form die edges and sidewalls. Optionally a first conformal coating is applied to the front side of the wafer; this step may be carried out prior to wafer thinning, as shown for example in FIG. 27. For this optional procedure, the wafer optionally is mounted on a backing tape in a wafer processing tool (not shown in any of the FIGs.) (2710), and then the optional frontside conformal coating is applied to the front surface of the wafer (2714). Alternatively, the optional frontside coating may be applied at a later stage, for example following wafer thinning (2714'); backgrind tape is applied to the front side of the wafer (2704); the backing tape (if present, that is, if procedure 2710 was carried out) is removed from the wafer backside and the wafer is thinned by backgrinding to the desired die thickness (2708); optionally a die attach film is applied to the wafer backside (2716) and the backgrind tape is removed if it was not removed earlier; the wafer is mounted on a dicing tape, with the backside (that is, the optional die attach film, or the thinned wafer backside) toward the tape (2718); if not done earlier, the optional frontside coating may be applied (2714'). Thereafter a cutting procedure is performed; this procedure may cut through the wafer and the die attach film on all streets, resulting in singulated die in a wafer array (2720); or, the wafer may be cut on streets fronted by an interconnect edge to a depth through the die thickness, and the wafer may be cut in streets not fronted by an interconnect edge to a depth less than the die thickness (2721); following a procedure 2720 or 2721 a conformal coating is applied to the wafer array front side and the grooves resulting from the cutting procedure (2722), that is, on the die front sides and sidewalls or die edges; following a procedure 2722, openings are formed through the conformal coating to expose interconnect pads and to sever the coating in the fully-cut grooves between the die (2724); following a procedure 2724, if the cutting procedure 2720 had been followed, the die are singulated, and can be manipulated using a pick-and-place tool (not shown in any of the FIGs.) (2726); alternatively, following a procedure 2724, if the cutting procedure 2721 had been followed, the wafer array is cut all the way through along the streets that were earlier partially cut (2813), resulting in singulated die which can be manipulated using a pick-and-place tool (2726). The procedures outlined with reference to 2710 and 2714 are independently optional; both procedures may be employed; or, optionally, the procedure 2714 may be employed and the procedure 2710 omitted; or, more unusually, the procedure 2710 may be employed and the procedure 2714 omitted.

Figure 28:
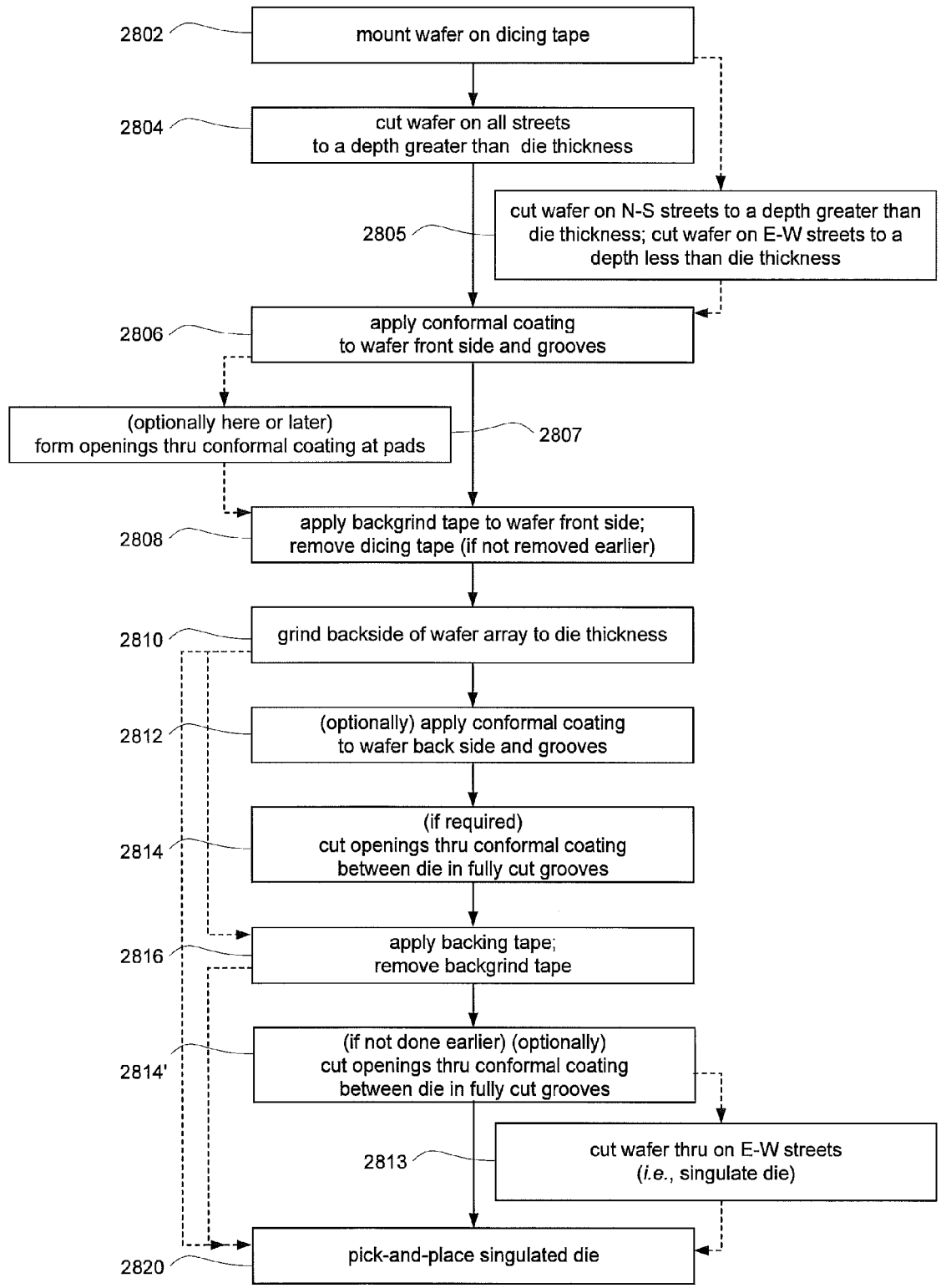
FIG. 28 is a flow diagram showing stages in an embodiment of a process for making a passivated die, as outlined generally above with reference to FIGS. 12 through 15 and 21 through 24B.

FIG. 28 is a flow diagram showing a sequence of stages in a process for making a passivated semiconductor die according to another embodiment of the invention. In this embodiment the wafer is cut to form die edges and die sidewalls (on at least some edges) prior to thinning the wafer to the eventual die thickness, and a conformal coating is applied to front and back sides. The wafer is mounted on a dicing tape (2802), and the wafer is thereafter cut by one of two approaches (2804 or 2805); particularly, in one approach the (unthinned) wafer is cut on all streets to a depth below the eventual die thickness (2804), while in the other approach the (unthinned) wafer is cut on the streets that are fronted by interconnect margins to a depth below the eventual die thickness to form die edges and sidewalls, and is cut on the other streets to a depth less than the eventual die thickness, to form die edges and a part of die sidewalls (2805); after the cutting procedure a conformal coating is applied to the wafer front side, coating the die front sides, edges and sidewalls, and the grooves (2806); optionally (that is, at this stage or at a later stage in the process) openings are formed through the conformal coating to expose interconnect pads (2807); a backgrind tape is applied to the wafer front side (2808) and the dicing tape is removed (if it had not been removed earlier) (2808); the wafer is thinned by backgrinding to the prescribed die thickness (2810), opening the grooves formed by cutting to below die thickness (in all streets, 2804, or in streets that are fronted by interconnect margins, 2805); if a procedure 2804 had been used, the procedure 2810 results in singulated die, which can be mounted on a backing tape and the backgrind tape removed (2816), and then manipulated using a pick-and-place tool (2820); if a procedure 2805 had been used, a backing tape is applied, and the backgrind tape is removed (2816); following an optional procedure (if not done earlier) of cutting openings thru the conformal coating (where present) between die in the fully cut grooves (2814'), the wafer array is now cut thru on the streets not fronted by interconnect margins, that were partially cut earlier, resulting in singulated die (2813), which can be manipulated using a pick-and-place tool (2820).

Figure 29:
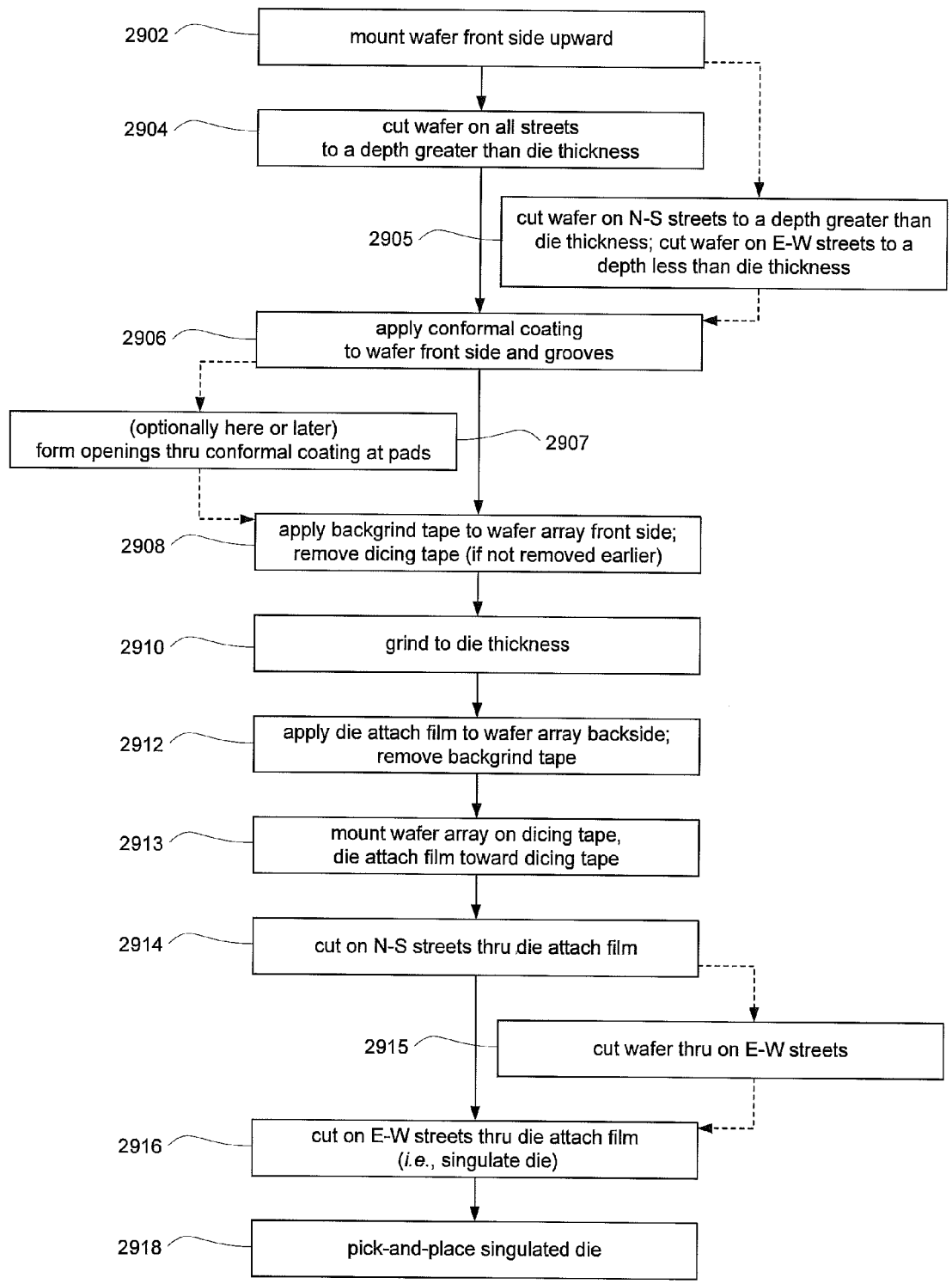
FIG. 29 is a flow diagram showing stages in an embodiment of a process for making a passivated die, as outlined generally above with reference to FIGS. 12 through 20B.

FIG. 29 is a flow diagram showing a sequence of stages in a process for making a passivated semiconductor die according to an embodiment of the invention. In this embodiment the wafer is cut to form die edges and die sidewalls (on at least some edges) prior to thinning the wafer to the eventual die thickness, and a conformal coating is applied to front sides and a dielectric film (such as a die attach film) is applied to back sides. Procedures 2902 through 2910 are similar to procedures 2802 through 2810 in FIG. 28. Here, following thinning the wafer to eventual die thickness 2910, a die attach film (in this example) is applied to the wafer (die array) backside (2912); the wafer (die array) is mounted on a dicing tape (with the die attach film toward the tape) (2913); the die attach film is cut through in the streets fronted by interconnect edges (2914); if the cutting procedure 2904 was employed, the die attach film is also cut through on the streets not fronted by interconnect edges (2916), or, if the cutting procedure 2905 was employed, the wafer is cut through on the streets not fronted by interconnect margins (2915) and the die attach film is cut through on the streets not fronted by interconnect edges (2916); the severing procedure 2916 results in singulated die backed by die attach film, which can be demounted from the support using a pick-and-place tool (not shown in any of the FIGs.) (2918). The procedures outlined with reference to 2915 and 2916 may be carried out sequentially or in a continuous cut-through operation.

As noted above with reference to FIGS. 28 and 29, in one approach to wafer cutting (2805, 2905) the streets fronted by interconnect margins are cut through to below die thickness, and the remaining streets are cut more shallowly (or, as noted above, not cut at all in this first wafer cutting operation). When the wafer is subsequently thinned, an array of strips or rows of connected die is formed, rather than an array of singulated die. This may be preferred, because singulated die may be shifted out of register (that is, some of the die may rotate or move during processing, so called "die tilt"), resulting in narrowing of some streets or misalignment of die features (for example, the interconnect pads); and an array of strips is less likely than an array of singulated die to shift. Narrowing of a street can cause interference with a subsequent cutting operation in the street, even by a narrower tool, such as a cutting operation to sever a die attach film or a conformal coating in the street between die. Various cutting depths may be specified. In one example, a standard wafer may have a thickness about 29 mil and, where a die thickness of 50 um is desired, the streets fronted by interconnect margins may be cut to a depth about 65 um (about 15 um deeper than the eventual die thickness), and the other streets may be cut to a depth nominally about 15 um, defining die edges along those streets. Then the conformal coating is applied, coating the front sides of the die, the die edges and sidewalls that are formed along the interconnect edges, and the die edges and partial sidewalls that are formed by the shallower cuts. Subsequent cutting through the streets that are not fronted by interconnect edges does not impact the conformal coating at the front die surface, providing clean coated edges all around the resulting singulated die.

The later cut thru the streets that are not fronted by interconnect edges, and thru the conformal coating or backside dielectric (die attach film), is narrower than the initial cuts, employing a narrower saw, for example, or a narrower cutting tool specification.

Other embodiments are within the claims.

For example, while the FIGs. showing interconnect ready die show die passivated on the backside as well as the front side and the sidewalls, passivated interconnect-ready die according to the invention may have the backside exposed. And, for example, while the FIGs. showing interconnect-ready die show off-die interconnect terminals, interconnect-ready die passivated according the invention may be provided with other interconnect terminal configurations. And, for example, spacers may optionally be provided in adjacent die in stacked die assemblies.

And, for example, while the FIGs. show chip constructs having interconnect pads arranged in interconnect margins along two opposite interconnect edges of each die, other chip constructs are within the invention. Particularly, the die may have interconnect pads arranged in an interconnect margin along only one interconnect edge; or, three die edges may have pads, and may constitute interconnect edges; or all four die edges may have pads, and may constitute interconnect edges. The die as provided from the manufacturer may have peripheral pads (peripheral pad die), or, the die as provided have die pads arranged in one or two rows near the center of the die (center pad die). The die may be "rerouted" (from the center to a die edge; or from one die edge to another) to provide a suitable arrangement of interconnect pads at or near one or more of the edges of the die. As may be appreciated, it may not be necessary to have die sidewalls protected by the conformal coating on noninterconnect edges or sidewalls, inasmuch as no contact with electrical interconnects is expected at those sidewalls.

All patents and patent applications referred to herein are hereby incorporated herein by reference.

We claim:

1. A method for making a passivated semiconductor die, the method comprising
   providing a wafer having a front side in which semiconductor chip active regions are formed, the semiconductor chip active regions being bounded by saw streets, the semiconductor chip active regions having interconnect pads arranged in an interconnect margin along an interconnect edge thereof;
   cutting the wafer front side on all streets to form grooves to a depth greater than a die thickness;
   applying a conformal coating to the front side and the grooves; and
   thinning the wafer to the die thickness.

2. A method for making a passivated semiconductor die, the method comprising
   providing a wafer having a front side in which semiconductor chip active regions are formed, the semiconductor chip active regions being bounded by saw streets, the semiconductor chip active regions having interconnect pads arranged in an interconnect margin along an interconnect edge thereof;
   cutting the wafer front side on streets that are fronted by interconnect margins to a depth greater than a die thickness to form die edges and sidewalls;
   cutting the wafer front side on streets that are not fronted by interconnect margins to a depth less than the eventual die thickness to form die edges and a part of die sidewalls;
   applying a conformal coating to the front side, the die edges, the sidewalls and the part sidewalls;
   thinning the wafer to the die thickness; and
   cutting through the wafer on streets that are not fronted by interconnect margins.

3. The method of claim 2, further comprising, prior to cutting through the wafer on streets that are not fronted by interconnect margins,
   cutting openings through the conformal coating between the die.

4. The method of claim 2, further comprising, prior to cutting through the wafer on streets that are not fronted by interconnect margins, forming openings exposing at least portions of interconnect pads.

5. A method for making a passivated semiconductor die, the method comprising
   providing a wafer having a front side in which semiconductor chip active regions are formed, the semiconductor chip active regions being bounded by saw streets, the semiconductor chip active regions having interconnect pads arranged in an interconnect margin along an interconnect edge thereof;
   cutting the wafer front side on streets that are fronted by interconnect margins to a depth greater than a die thickness to form die edges and sidewalls;
   cutting the wafer front side on streets that are not fronted by interconnect margins to a depth less than the eventual die thickness to form die edges and a part of die sidewalls;
   applying a conformal coating to the front side, the die edges, the sidewalls and the part sidewalls;
   thinning the wafer to the die thickness;
   applying a die attach film to the wafer backside; and
   cutting through the wafer on streets that are not fronted by interconnect margins.

6. The method of claim 5, further comprising, prior to cutting through the wafer on streets that are not fronted by interconnect margins, cutting through the die attach film on streets that are fronted by interconnect margins.

7. The method of claim 6, further comprising cutting through the die attach film on streets that are not fronted by interconnect margins.

8. The method of claim 7 wherein cutting through the die attach film and cutting through the wafer on streets that are not fronted by interconnect margins are carried out sequentially.

9. The method of claim 6, further comprising, subsequent to cutting through the wafer on streets that are not fronted by interconnect margins, cutting through the die attach film on streets that are not fronted by interconnect margins.

10. The method of claim 6 wherein cutting through the die attach film and cutting through the wafer on streets that are not fronted by interconnect margins are carried out in a continuous operation.

11. The method of claim 6 wherein cutting through the die attach film and cutting through the wafer on streets that are not fronted by interconnect margins are carried out sequentially.

12. The method of claim 5, further comprising, prior to cutting through the wafer on streets that are not fronted by interconnect margins, forming openings exposing at least portions of interconnect pads.

13. A method for making a passivated semiconductor die, the method comprising
   providing a wafer having a front side in which semiconductor chip active regions are formed, the semiconductor chip active regions being bounded by saw streets, the semiconductor chip active regions having interconnect pads arranged in an interconnect margin along an interconnect edge thereof;
   thinning the wafer to a die thickness;
   cutting through the wafer on streets that are fronted by interconnect margins to form die edges and sidewalls;
   cutting the wafer front side on streets that are not fronted by interconnect margins to a depth less than the die thickness to form die edges and a part of die sidewalls;
   applying a conformal coating to the front side, the die edges, the sidewalls and the part sidewalls; and
   cutting through the wafer on streets that are not fronted by interconnect margins.

14. The method of claim 13, further comprising, prior to cutting through the wafer on streets that are not fronted by interconnect margins, forming openings exposing at least portions of interconnect pads.

15. The method of claim 13, further comprising, prior to cutting through the wafer on streets that are not fronted by interconnect margins, cutting openings through the conformal coating between the die.

16. The method of claim 13, further comprising, subsequent to thinning the wafer, applying a die attach film to the wafer backside.

17. The method of claim 16, further comprising cutting through the die attach film on streets that are fronted by interconnect margins.

18. The method of claim 16, further comprising cutting through the die attach film on streets that are not fronted by interconnect margins.

19. A method for making a passivated semiconductor die, the method comprising
   providing a wafer having a front side in which semiconductor chip active regions are formed, the semiconductor chip active regions being bounded by saw streets, the semiconductor chip active regions having interconnect pads arranged in an interconnect margin along an interconnect edge thereof;

thinning the wafer to a die thickness;

cutting through the wafer on streets that are fronted by interconnect margins to form die edges and sidewalls;

applying a conformal coating to the front side, the die edges and the sidewalls; and cutting through the wafer on streets that are not fronted by interconnect margins.

20. The method of claim 19, further comprising, prior to applying the conformal coating cutting the wafer front side on streets that are not fronted by interconnect margins to a depth less than the die thickness to form die edges and a part of die sidewalls;

wherein applying the conformal coating further comprises applying the conformal coating to the part sidewalls.

21. The method of claim 19, further comprising, prior to cutting through the wafer on streets that are not fronted by interconnect margins, forming openings exposing at least portions of interconnect pads.

22. The method of claim 19, further comprising, prior to cutting through the wafer on streets that are not fronted by interconnect margins, cutting openings through the conformal coating between the die.

23. The method of claim 19, further comprising, subsequent to thinning the wafer, applying a die attach film to the wafer backside.

24. The method of claim 23, further comprising cutting through the die attach film on streets that are fronted by interconnect margins.

25. The method of claim 23, further comprising cutting through the die attach film on streets that are not fronted by interconnect margins.

\* \* \* \* \*